(12) United States Patent
Ikeda et al.

(10) Patent No.: US 8,687,409 B2
(45) Date of Patent: Apr. 1, 2014

(54) VARIABLE RESISTANCE NONVOLATILE MEMORY DEVICE

(75) Inventors: Yuichiro Ikeda, Hyogo (JP); Kazuhiko Shimakawa, Osaka (JP); Ryotaro Azuma, Osaka (JP); Ken Kawai, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/639,120

(22) PCT Filed: May 30, 2012

(86) PCT No.: PCT/JP2012/003543
§ 371 (c)(1),
(2), (4) Date: Oct. 3, 2012

(87) PCT Pub. No.: WO2012/164926
PCT Pub. Date: Dec. 6, 2012

(65) Prior Publication Data
US 2013/0114327 A1    May 9, 2013

(30) Foreign Application Priority Data
May 31, 2011 (JP) ................................ 2011-121318

(51) Int. Cl.
*G11C 11/00* (2006.01)
(52) U.S. Cl.
USPC ....................................................... 365/148
(58) Field of Classification Search
USPC ....................................................... 365/148
See application file for complete search history.

(56) References Cited

U.S. PATENT DOCUMENTS

| 6,081,450 | A  | 6/2000 | Nawaki |
| 7,508,695 | B2 | 3/2009 | Sugita |
| 8,125,817 | B2 | 2/2012 | Takagi et al. |
| 8,139,396 | B2 | 3/2012 | Kurosawa et al. |
| 2007/0195590 | A1 | 8/2007 | Sugita |
| 2010/0232208 | A1 | 9/2010 | Maejima et al. |

(Continued)

FOREIGN PATENT DOCUMENTS

| JP | 10-144086    | 5/1998 |
| JP | 2007-226884  | 9/2007 |
| JP | 2010-218615  | 9/2010 |
| JP | 2011-065737  | 3/2011 |

(Continued)

OTHER PUBLICATIONS

International Search Report issued Jul. 3, 2012 in International (PCT) Application No. PCT/JP2012/003543.

*Primary Examiner* — Hoai V Ho
*Assistant Examiner* — Pablo Huerta
(74) *Attorney, Agent, or Firm* — Wenderoth, Lind & Ponack, LLP.

(57) ABSTRACT

A variable resistance nonvolatile memory device including memory cells provided at cross-points of first signal lines and second signal lines, each memory cell including a variable resistance element and a current steering element connected to the variable resistance element in series, the variable resistance nonvolatile memory device including a write circuit, a row selection circuit, and a column selection circuit, wherein the write circuit: sequentially selects blocks in an order starting from a block farthest from at least one of the row selection circuit and the column selection circuit and finishing with a block closest to the at least one of the row selection circuit and the column selection circuit; and performs, for each of the selected blocks, initial breakdown on each memory cell included in the selected block.

13 Claims, 21 Drawing Sheets

(56) References Cited

U.S. PATENT DOCUMENTS

| | | |
|---|---|---|
| 2010/0321982 A1 | 12/2010 | Takagi et al. |
| 2011/0051500 A1* | 3/2011 | Takagi et al. ............ 365/148 |
| 2011/0069533 A1 | 3/2011 | Kurosawa et al. |
| 2012/0075913 A1 | 3/2012 | Kunitake et al. |
| 2012/0170353 A1* | 7/2012 | Iijima et al. ............ 365/148 |
| 2013/0250658 A1* | 9/2013 | Wei et al. ............ 365/148 |

FOREIGN PATENT DOCUMENTS

| | | |
|---|---|---|
| JP | 2012-069216 | 4/2012 |
| WO | 2007/141865 | 12/2007 |
| WO | 2010/070895 | 6/2010 |

* cited by examiner

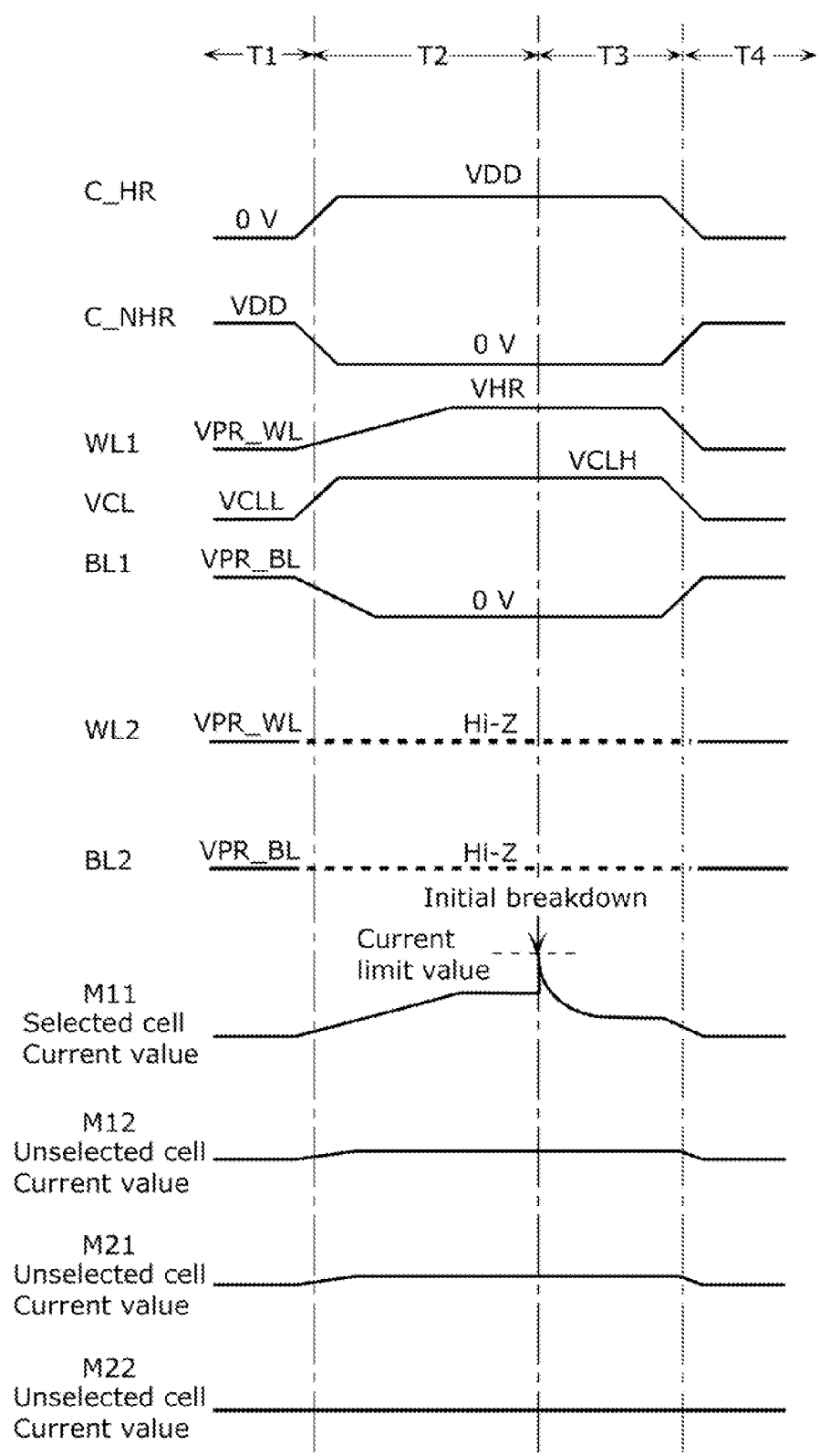

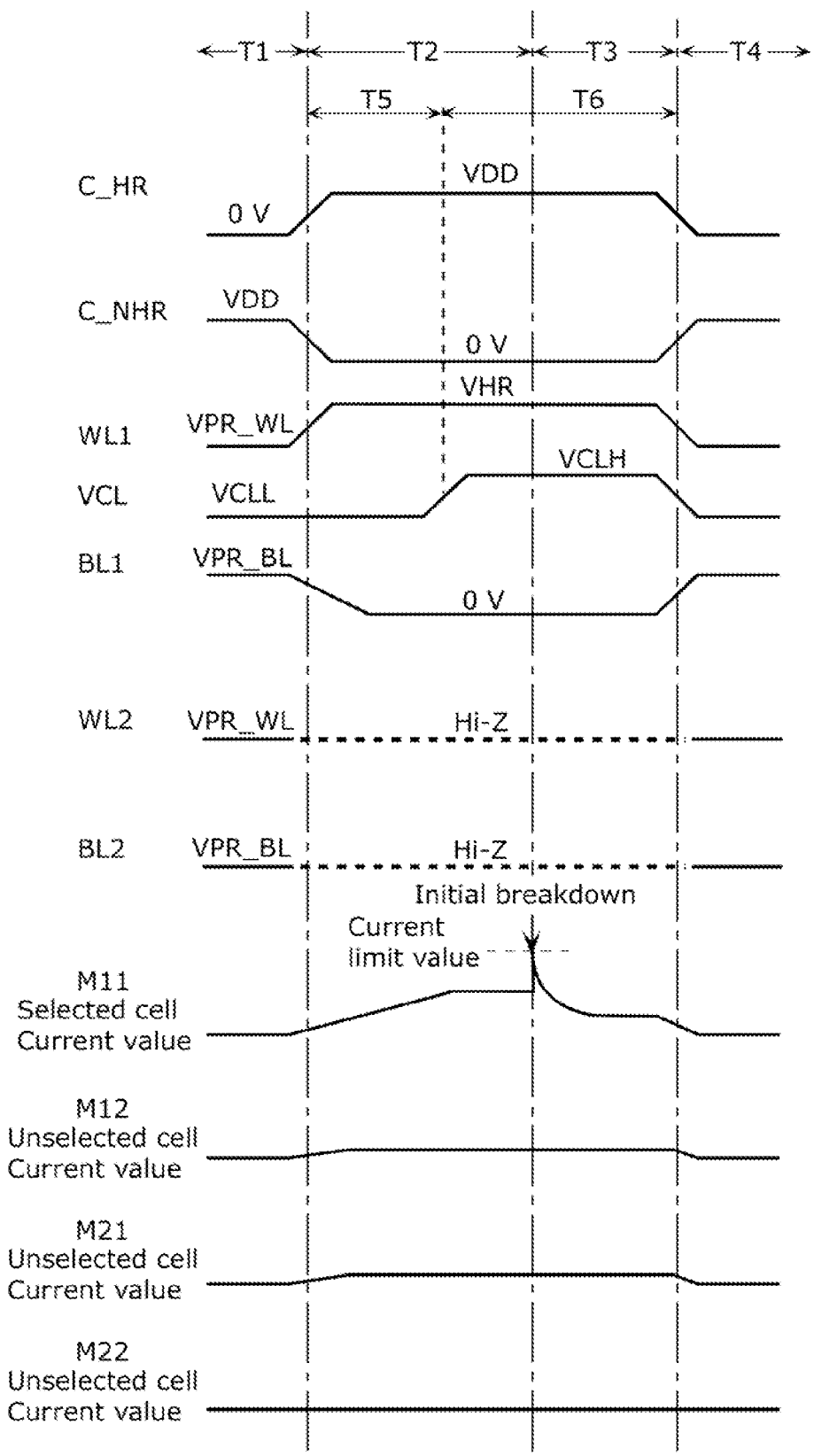

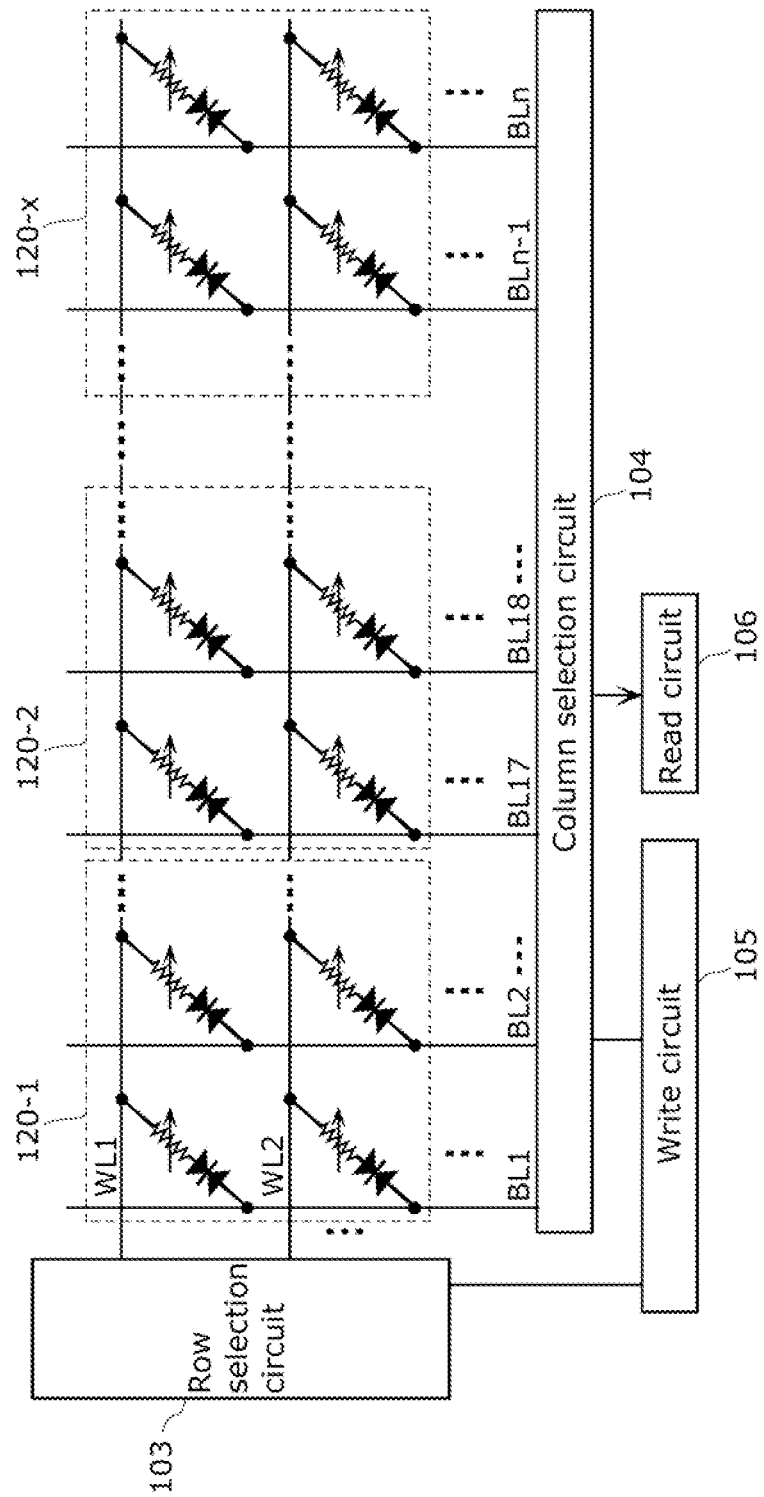

FIG. 23

|  |  | Memory cell position | | | | | | | |
|---|---|---|---|---|---|---|---|---|---|
|  |  | 1 | 2 | 3 | 4 | 5 | 6 | 7 | 8 |
| Case 1 | Initial state | L | L | L | L | L | L | L | L |
|  | Write operation |  | W ← | | W ← | | W ← | | W |
|  | Final data | L | H | L | H | L | H | L | H |
| Case 2 | Initial state | H | H | H | H | H | H | H | H |
|  | Write operation | E → | | E → | | E → | | E | |
|  | Final data | L | H | L | H | L | H | L | H |
| Case 3 | Initial state | H | L | H | L | H | L | H | L |
|  | Write operation | ↵ | W ← | | W ← | | W ← | | W |
|  | Intermediate data | H | H | H | H | H | H | H | H |
|  | Write operation | E → | | E → | | E → | | E | |
|  | Final data | L | H | L | H | L | H | L | H |
| Case 4 | Initial state | L | L | L | L | H | H | H | H |
|  | Write operation | ↵ | W ← | | W ← | | | | |
|  | Intermediate data | L | H | L | H | H | H | H | H |
|  | Write operation |  | | | | E → | | E | |
|  | Final data | L | H | L | H | L | H | L | H |

US 8,687,409 B2

VARIABLE RESISTANCE NONVOLATILE MEMORY DEVICE

TECHNICAL FIELD

The present invention relates to a variable resistance nonvolatile memory device including memory cells each having a current steering element and a variable resistance element whose resistance value reversibly changes based on electrical signals.

BACKGROUND ART

In recent years, progressive research and development has been conducted on nonvolatile memory devices including memory cells for which variable resistance elements are used. A variable resistance element is an element which has a property that its resistance value reversibly changes according to an electrical signal and which can store data corresponding to the resistance value in a nonvolatile manner.

Commonly known as a nonvolatile memory device including variable resistance elements is a nonvolatile memory device, referred to as a so-called 1T1R cross point memory, in which memory cells are arrayed in a matrix. In the 1T1R cross point memory, memory cells each including a transistor and a variable resistance element connected in series are provided at cross-points of orthogonally arranged bit lines and word lines.

Furthermore, a nonvolatile memory device aiming at higher integration, referred to as a so-called 1D1R cross point memory, is also known in which memory cells are arrayed in a matrix. In the 1D1R cross point memory, memory cells are provided at cross-points of orthogonally arranged bit lines and word lines. Each memory cell includes a bidirectional diode element functioning as a current steering element and a variable resistance element connected to the bidirectional diode element in series. Also known is a nonvolatile memory device including layers of memory cells of the 1D1R cross point memory. Conventionally, various methods have been proposed for writing in memory cells of such nonvolatile memory devices including variable resistance elements.

Patent Literature 1 (PL1) discloses, regarding the memory cells of a 1D1R cross point memory, a method of applying voltage to the word lines and bit lines in an initial breakdown operation, which is an operation of initializing the memory cells. FIG. 20 shows the configuration of the memory cell array of the nonvolatile memory device disclosed in PL1. FIG. 21 shows the waveforms of voltages applied to a selected word line, unselected word lines, selected bit lines, unselected bit lines at the time of performing the initial breakdown on the memory cell array.

The nonvolatile memory device of PL1 applies a selected voltage (VSS in FIG. 21) to the selected word line, and at the same time, places a plurality of selected bit lines in floating state. This reduces each of the voltages at the bit lines to which memory cells for which the initial breakdown has finished are connected. With this, stable initial breakdown is ensured even when the time lengths of the initial breakdown vary among the bits.

Patent Literature 2 (PL2) discloses a method of determining a writing order in the operation of writing in memory cells of a 1R cross point memory. FIG. 22 shows the configuration of the memory cell array of the nonvolatile memory device disclosed in PL2. FIG. 23 shows an order of memory cells, in the memory cell array, in which writing is performed.

As for the method of PL2, when unselected memory cells provided on the same line as a selected line include many memory cells in the high resistance state and when the resistance of such memory cells is to be decreased, writing starts from the memory cell farthest from the drive circuit. Furthermore, with this method, when there are many memory cells in the low resistance state on the same line and when the resistance of such memory cells is to be increased, writing starts from the memory cell nearest to the drive circuit. This method suppresses the adverse effect of leak current, prevents a decrease in the writing speed, and simplifies the control over the resistance values after writing.

CITATION LIST

Patent Literature

[PL1] Japanese Patent Application Publication No. 2010-218615 (FIG. 2 and FIG. 3)
[PL2] Japanese Patent Application Publication No. 2007-226884 (FIG. 10 and FIG. 12)

SUMMARY OF INVENTION

Technical Problem

However, there is a need for such variable resistance nonvolatile memory devices to perform more stable initial breakdown operation.

In view of the foregoing, it is an object of the present invention to provide a nonvolatile memory device which can perform stable initial breakdown on variable resistance nonvolatile memory elements included in a 1D1R cross point memory array.

Solution to Problem

To achieve the above object, the variable resistance nonvolatile memory device according to an aspect of the present invention is a variable resistance nonvolatile memory device including: a plurality of first signal lines; a plurality of second signal lines crossing the first signal lines; and a memory cell array including a plurality of memory cells provided at cross-points of the first signal lines and the second signal lines, each of the memory cells including a variable resistance element and a current steering element which is connected to the variable resistance element in series and has two terminals, the variable resistance element having a resistance state which changes to (i) a low resistance state when a first voltage of a predetermined first polarity is applied to the variable resistance element, and (ii) a high resistance state when a second voltage of a second polarity opposite to the first polarity is applied to the variable resistance element, the low resistance state being a state in which the variable resistance element has a resistance value in a first range, and the high resistance state being a state in which the variable resistance element has a resistance value in a second range higher than the first range, the variable resistance nonvolatile memory device including: a write circuit which performs (i) low resistance writing by which the resistance state of the variable resistance element changes to the low resistance state, by applying, to each of the memory cells, a low resistance writing voltage via a corresponding one of the first signal lines and a corresponding one of the second signal lines, and (ii) high resistance writing by which the resistance state of the variable resistance element changes to the high resistance state, by applying, to each of the memory cells, a high resistance writing voltage via the corresponding one of the first signal lines and the corresponding one of the second signal lines, the low resistance writing voltage being a voltage of the first polarity and greater than or equal to the first voltage in absolute value, and the high resistance writing voltage being a voltage of the second polarity and greater than or equal to the second voltage in absolute value; a first selection circuit which selects one of the first signal lines; and a second selection circuit which selects one of the second signal lines, wherein the memory cells are grouped into a plurality of blocks, each of the blocks includes a plurality of memory cells, and the write circuit further performs the following: performs initial breakdown on the variable resistance element in an initial state after the variable resistance nonvolatile memory device is manufactured, by applying an initial breakdown voltage to the variable resistance element via a corresponding one of the first signal lines and a corresponding one of the second signal lines, the initial breakdown being a process by which the initial state of the variable resistance element changes to a state in which resistance of the variable resistance element is variable through the low resistance writing and the high resistance writing, and the initial breakdown voltage being greater than the low resistance writing voltage and the high resistance writing voltage in absolute value; applies, in the initial breakdown, the initial breakdown voltage to the first signal line selected by the first selection circuit and the second signal line selected by the second selection circuit, via the first selection circuit and the second selection circuit; and sequentially selects blocks from among the blocks in an order starting from a block farthest from at least one of the first selection circuit and the second selection circuit and finishing with a block closest to the at least one of the first selection circuit and the second selection circuit, and performs, for each of the selected blocks, the initial breakdown on each of memory cells included in the selected block.

Advantageous Effects of Invention

With this, the present invention provides a variable resistance nonvolatile memory device which can perform stable initial breakdown on variable resistance elements in a 1D1R cross point memory array.

BRIEF DESCRIPTION OF DRAWINGS

FIG. 13A is a timing chart showing an operation of a variable resistance nonvolatile memory device according to Embodiment 1 of the present invention.

FIG. 13B is a timing chart showing an operation of a variable resistance nonvolatile memory device according to Embodiment 1 of the present invention.

FIG. 14 shows a configuration of a memory cell array according to Embodiment 2 of the present invention.

FIG. 23 shows an example of data writing performed in a writing order determined by a conventional data writing method.

Figure 1:
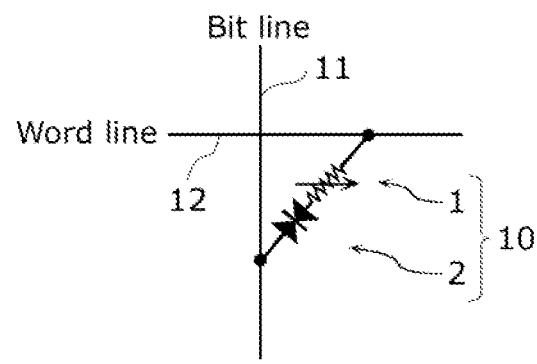
FIG. 1 is a circuit diagram of a memory cell according to Embodiment 1 of the present invention.

DESCRIPTION OF EMBODIMENTS (Underlying Knowledge Forming the Basis of the Present Invention)

The inventors of the present invention have considered a method for the initial breakdown operation in, as one of variable resistance nonvolatile memory devices, a 1D1R cross point memory array including memory cells each having a current steering element and a variable resistance element. The initial breakdown normally makes the resistance values of the memory cells less than the resistance values just after manufacturing.

In the variable resistance nonvolatile memory device, the initial breakdown operation generally starts from memory cells nearer to the drive circuit in the array to the memory cells farther from the drive circuit in the array. With the 1D1R cross point memory array, however, the number of variable resistance elements in the low resistance state increases as the initial breakdown of the memory cells proceeds in the array. This causes an increase in leak current via the current steering elements of unselected memory cells. From this, the inventors have found the problem that the initial breakdown operation is more difficult on memory cells which are located farther away from the drive circuit.

In view of the above problem, the embodiments describe a nonvolatile memory device which can perform stable initial breakdown on variable resistance nonvolatile memory elements included in a 1D1R cross point memory array, regardless of the positions of the variable resistance nonvolatile memory elements in the memory cell array.

To solve the above problem, the variable resistance nonvolatile memory device according to an aspect of the present invention is a variable resistance nonvolatile memory device including: a plurality of first signal lines; a plurality of second signal lines crossing the first signal lines; and a memory cell array including a plurality of memory cells provided at crosspoints of the first signal lines and the second signal lines, each of the memory cells including a variable resistance element and a current steering element which is connected to the variable resistance element in series and has two terminals, the variable resistance element having a resistance state which changes to (i) a low resistance state when a first voltage of a predetermined first polarity is applied to the variable resistance element, and (ii) a high resistance state when a second voltage of a second polarity opposite to the first polarity is applied to the variable resistance element, the low resistance state being a state in which the variable resistance element has a resistance value in a first range, and the high resistance state being a state in which the variable resistance element has a resistance value in a second range higher than the first range, the variable resistance nonvolatile memory device including: a write circuit which performs (i) low resistance writing by which the resistance state of the variable resistance element changes to the low resistance state, by applying, to each of the memory cells, a low resistance writing voltage via a corresponding one of the first signal lines and a corresponding one of the second signal lines, and (ii) high resistance writing by which the resistance state of the variable resistance element changes to the high resistance state, by applying, to each of the memory cells, a high resistance writing voltage via the corresponding one of the first signal lines and the corresponding one of the second signal lines, the low resistance writing voltage being a voltage of the first polarity and greater than or equal to the first voltage in absolute value, and the high resistance writing voltage being a voltage of the second polarity and greater than or equal to the second voltage in absolute value; a first selection circuit which selects one of the first signal lines; and a second selection circuit which selects one of the second signal lines, wherein the memory cells are grouped into a plurality of blocks, each of the blocks includes a plurality of memory cells, and the write circuit further performs the following; performs initial breakdown on the variable resistance element in an initial state after the variable resistance nonvolatile memory device is manufactured, by applying an initial breakdown voltage to the variable resistance element via a corresponding one of the first signal lines and a corresponding one of the second signal lines, the initial breakdown being a process by which the initial state of the variable resistance element changes to a state in which resistance of the variable resistance element is variable through the low resistance writing and the high resistance writing, and the initial breakdown voltage being greater than the low resistance writing voltage and the high resistance writing voltage in absolute value; applies, in the initial breakdown, the initial breakdown voltage to the first signal line selected by the first selection circuit and the second signal line selected by the second selection circuit, via the first selection circuit and the second selection circuit; and sequentially selects blocks from among the blocks in an order starting from a block farthest from at least one of the first selection circuit and the second selection circuit and finishing with a block closest to the at least one of the first selection circuit and the second selection circuit, and performs, for each of the selected blocks, the initial breakdown on each of memory cells included in the selected block.

With this structure, the variable resistance nonvolatile memory device according to an aspect of the present invention can reduce leak current to a memory cell for which the initial breakdown has finished. Accordingly, the variable resistance nonvolatile memory device can reduce the adverse effect of the leak current on the initial breakdown of a selected memory cell. In such a manner, the variable resistance nonvolatile memory device can perform stable initial breakdown on the variable resistance elements in a 1D1R cross point memory array regardless of the positions of the variable resistance elements in the memory cell array.

Furthermore, for each of the selected blocks, the write circuit may sequentially select memory cells from among the memory cells included in the selected block, in an order starting from a memory cell farthest from at least one of the first selection circuit and the second selection circuit and finishing with a memory cell closest to the at least one of the first selection circuit and the second selection circuit, and perform the initial breakdown on each of the selected memory cells.

Furthermore, the write circuit may sequentially select blocks from among the blocks in a zigzag manner in an order starting from a block farthest from the first selection circuit and farthest from the second selection circuit and finishing with a block closest to the first selection circuit and closest to the second selection circuit, and perform, for each of the selected blocks, the initial breakdown on each of memory cells included in the selected block.

Furthermore, the blocks may be arrayed in rows and columns, and the write circuit may: sequentially select lines from among a plurality of lines which are either the rows or columns of the blocks and are in parallel to the first signal lines, in an order starting from a line farthest from the second selection circuit and finishing with a line closest to the second selection circuit; and for each of the selected lines, sequentially select blocks from among a plurality of blocks arrayed in the selected line, in an order starting from a block farthest from the first selection circuit and finishing with a block closest to the first selection circuit.

Moreover, the variable resistance nonvolatile memory device may further include a plurality of inter-block switches each provided between the blocks arrayed in the first signal lines, wherein the write circuit may perform the initial breakdown on memory cells included in a selected first block, and then turn off one of the inter-block switches which is provided between the first block and a second block before performing the initial breakdown on the second block, the second block being adjacent to the first block on a side of the one of the first selection circuit and the second selection circuit.

With this structure, the variable resistance nonvolatile memory device according to an aspect of the present invention can eliminate leak current to a memory cell for which the initial breakdown has finished. Accordingly, the variable resistance nonvolatile memory device can perform the initial breakdown on a selected memory cell without being adversely affected by the leak current, thereby being capable of performing even more stable initial breakdown on the variable resistance element.

Furthermore, the variable resistance nonvolatile memory device may further include a current limit circuit which is provided on a path of current flowing from the write circuit to the memory cells, and limits, between current in a first direction and current in a second direction, only the current in the first direction, the current in the first direction being current which changes resistance states of the memory cells to the high resistance state, and the current in the second direction being current which changes the resistance states of the memory cells to the low resistance state, wherein the write circuit may apply, in the initial breakdown, the initial breakdown voltage of the second polarity to the memory cells, and the current limit circuit may limit, in the initial breakdown, the current flowing in the path in the first direction.

With this structure, the variable resistance nonvolatile memory device according to an aspect of the present invention can limit the current flowing in a memory cell at the time of the initial breakdown. Accordingly, the variable resistance nonvolatile memory device can perform the initial breakdown on the variable resistance element in the 1D1R cross point memory array without compromising the reliability of the current steering element.

Moreover, each of the memory cells may have a resistance state which changes to (i) the low resistance state when the first voltage of the first polarity is applied to the memory cell via a connected one of the first signal lines and a connected one of the second signal lines and (ii) the high resistance state when the second voltage of the second polarity opposite to the first polarity is applied to the memory cell via the connected one of the first signal lines and the connected one of the second signal lines, the first voltage of the first polarity being a voltage when a voltage at the connected one of the first signal lines is higher than a voltage at the connected one of the second signal lines, the write circuit may include (i) a first drive circuit which generates a first drive voltage greater than or equal to the first voltage, (ii) a second drive circuit which generates a second drive voltage greater than or equal to the second voltage, (iii) a third drive circuit which generates a reference voltage for the first drive voltage, and (iv) a fourth drive circuit which generates a reference voltage for the second drive voltage, the first selection circuit may select one of the first signal lines, and connects the selected first signal line with the first drive circuit and the fourth drive circuit, the second selection circuit may select one of the second signal lines, and connect the selected second signal line with the second drive circuit and the third drive circuit, and the current limit circuit may be provided between the fourth drive circuit and the first selection circuit.

Moreover, each of the memory cells may have a resistance state which changes to (i) the low resistance state when the first voltage of the first polarity is applied to the memory cell via a connected one of the first signal lines and a connected one of the second signal lines and (ii) the high resistance state when the second voltage of the second polarity opposite to the first polarity is applied to the memory cell via the connected one of the first signal lines and the connected one of the second signal lines, the first voltage of the first polarity being a voltage when a voltage at the connected one of the first signal lines is higher than a voltage at the connected one of the second signal lines, the write circuit may include (i) a first drive circuit which generates a first drive voltage greater than or equal to the first voltage, (ii) a second drive circuit which generates a second drive voltage greater than or equal to the second voltage, (iii) a third drive circuit which generates a reference voltage for the first drive voltage, and (iv) a fourth drive circuit which generates a reference voltage for the second drive voltage, the first selection circuit may select one of the first signal lines, and connects the selected first signal line with the first drive circuit and the fourth drive circuit, the second selection circuit may select one of the second signal lines, and connects the selected second signal line with the second drive circuit and the third drive circuit, and the current limit circuit may be provided between the second drive circuit and the second selection circuit.

Furthermore, the current limit circuit may (i) limit, in a first period, a value of the current flowing in the path in the first direction to a first current value, and (ii) limit, in a second period, the value of the current flowing in the path in the first direction to a second current value smaller than the first current value, the first period starting after application of the initial breakdown voltage to the memory cell starts and ending before the initial breakdown is performed on the memory cell, and the second period starting after the first period and including a time at which the initial breakdown is performed on the memory cell.

With this structure, the variable resistance nonvolatile memory device according to an aspect of the present invention can reduce the time that elapses before the voltage at either the selected first signal line or the selected second signal line reaches the initial breakdown voltage. As a result, the variable resistance nonvolatile memory device can perform the initial breakdown at high speed.

Furthermore, the current limit circuit may detect that a voltage at either the selected first signal line or the selected second signal line has reached a predetermined voltage, and change a value of current to be limited, from the first current value to the second current value when detecting that the voltage at either the selected first signal line or the selected second signal line has reached the predetermined voltage.

With this structure, the variable resistance nonvolatile memory device according to an aspect of the present invention can automatically control the time at which the current is limited.

Moreover, the variable resistance nonvolatile memory device further includes a capacitive load element; and a selection switch which turns on and off a connection between the capacitive load element and a node between the current limit circuit and the first selection circuit, wherein the selection switch may turn on the connection between the capacitive load element and the node at a time of the initial breakdown.

With this structure, the variable resistance nonvolatile memory device according to an aspect of the present invention can reduce the fluctuations in the voltage at the first signal line which occur at the time of the initial breakdown. Thus, the variable resistance nonvolatile memory device can perform even more stable initial breakdown.

Moreover, the variable resistance nonvolatile memory device may further includes: a capacitive load element; and a selection switch which turns on and off a connection between the capacitive load element and a node between the current limit circuit and the second selection circuit, wherein the selection switch may turn on the connection between the capacitive load element and the node at a time of the initial breakdown.

With this structure, the variable resistance nonvolatile memory device according to an aspect of the present invention can reduce the fluctuations in the voltage at the second signal line which occur at the time of the initial breakdown. Thus, the variable resistance nonvolatile memory device can perform even more stable initial breakdown.

Furthermore, the variable resistance element may include a first electrode, a second electrode, and a transition metal oxide layer interposed between the first electrode and the second electrode, and the transition metal oxide layer may include (i) an oxygen-deficient first transition metal oxide layer in contact with the first electrode and (ii) a second transition metal oxide layer in contact with the second electrode and less than the oxygen-deficient first transition metal oxide layer in degree of oxygen deficiency.

Note that the present invention can be implemented not only as such a variable resistance nonvolatile device but also as a method of performing initial breakdown on a variable resistance nonvolatile device wherein the method includes, as steps, the characteristic elements included in the variable resistance nonvolatile device. Moreover, the present invention can be implemented as a method for manufacturing such a variable resistance nonvolatile device.

In addition, the present invention can be implemented as: a semiconductor integrated circuit (LSI) which achieves part or all of the functions of such a variable resistance nonvolatile device; and a memory device which includes such a variable resistance nonvolatile device.

Hereinafter, embodiments of a variable resistance nonvolatile memory device according to an implementation of the present invention will be described in detail with accompanying drawings. The numerical values, shapes, materials, structural elements, the arrangement and connection of the structural elements, steps, the processing order of the steps etc. shown in the following embodiments are mere examples, and thus do not limit the present invention. Furthermore, among the structural elements in the following embodiments, those not recited in the independent claims indicating the most generic concept of the present invention are described as arbitrary structural elements.

Embodiment 1

A variable resistance nonvolatile memory device according to Embodiment 1 of the present invention limits current flowing in a path from a write circuit to a memory cell at the time of initial breakdown. With this, the variable resistance nonvolatile memory device can perform the initial breakdown on the variable resistance element in the 1D1R cross point memory array without compromising the reliability of the current steering element.

First, the following describes a configuration of a memory cell included in the variable resistance nonvolatile memory device according to Embodiment 1 of the present invention.

FIG. 1 is a circuit diagram of one of memory cells 10 (cross point memory cells) included in the variable resistance nonvolatile memory device according to Embodiment 1 of the present invention. As shown in FIG. 1, memory cells 10 according to the present embodiment are bipolar type memory cells whose resistance values change upon application of voltages or currents having different polarities and greater than or equal to a predetermined threshold. Each bipolar type memory cell 10 includes: a variable resistance element 1 that is a variable resistance nonvolatile memory element 1 whose resistance changes upon application of bidirectional voltage or current; and a current steering element 2 connected to the variable resistance element 1 in series.

The variable resistance element 1 can be in, at least, the low resistance state and the high resistance state, and store information according to a reversible change in the resistance value (resistance state) based on an electrical signal applied. Specifically, the variable resistance element 1 has a property that its resistance state changes to the low resistance state when the absolute value of a voltage applied to the variable resistance element 1 in the high resistance state exceeds a predetermined first voltage, and that its resistance state changes to the high resistance state when the absolute value of a voltage applied to the variable resistance element 1 in the low resistance state in the direction (reverse polarity) opposite to the direction (application polarity) in which the first voltage is applied exceeds a predetermined second voltage.

The current steering element 2, which is a bidirectional diode element, has nonlinear current characteristics with respect to an applied voltage, and is bidirectional, meaning that current flows in the current steering element 2 bidirectionally (into the positive voltage region and the negative voltage region).

Figure 2:
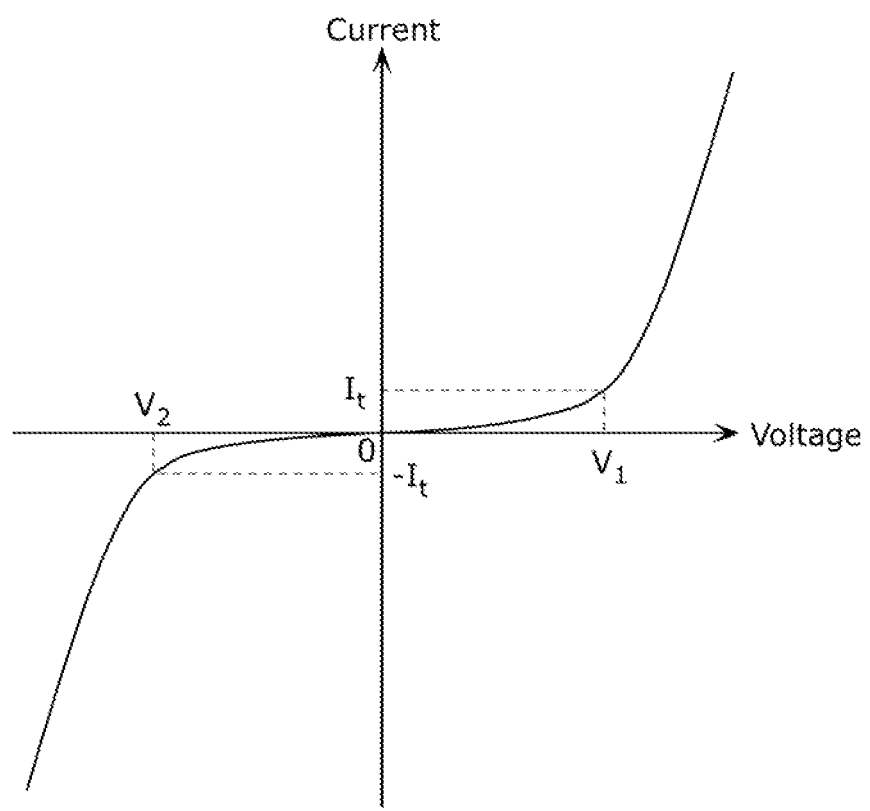
FIG. 2 is a graph showing an example of voltage-current characteristics of a current steering element according to Embodiment 1 of the present invention.

FIG. 2 shows an example of voltage-current characteristics of the current steering element 2. $I_t$ (>0) represents a predetermined current value which determines a threshold voltage, $V_1$ represents a first threshold voltage (positive threshold voltage), and $V_2$ represents a second threshold voltage (negative threshold voltage). As shown in FIG. 2, these characteristics are nonlinear, and in a region in which a voltage V satisfies $V_2<V<V_1$, the resistance is high and no current substantially flows. At this time, given that I is current flowing through the current steering element 2, I satisfies $-I_t<I<I_t$. In contrast, in a region in which the voltage V satisfies $V≤V_2$ or $V_1≤V$, the resistance value falls rapidly, allowing a large current to flow. At this time, $I_t≤I$ is satisfied in a region in which $V_1≤V$ is satisfied, and $I≤-I_t$ is satisfied in a region in which $V≤V_2$ is satisfied.

Here, a threshold voltage means a voltage when a predetermined current flows. The predetermined current here has a value which can be arbitrarily determined in order to determine a threshold voltage, and is determined according to the characteristics of an element controlled by the current steering element 2 or the characteristics of the current steering element 2. Normally, a current when the state in which no current substantially flows shifts to the state in which a large current flows is determined as a threshold current.

Note that although FIG. 2 shows that the magnitude of the current when a positive voltage is applied and the magnitude of the current when a negative voltage is applied have origin symmetry, these current magnitudes do not necessarily need to be symmetrical. For example, $|V_1|$ may be smaller than $|V_2|$, or $|V_2|$ may be smaller than $|V_1|$.

By the bipolar type memory cell 10 provided between a bit line 11 and a word line 12, a 1-bit memory element is realized.

FIG. 1 shows that one terminal of the variable resistance element 1 is connected to the word line 12, the other terminal of the variable resistance element 1 and one terminal of the current steering element 2 are connected to each other, and the other terminal of the current steering element 2 is connected to the bit line 11. However, one terminal of the variable resistance element 1 may be connected to the bit line 11, the other terminal of the variable resistance element 1 and one terminal of the current steering element 2 may be connected to each other, and the other terminal of the current steering element 2 may be connected to the word line 12.

Figure 3A:
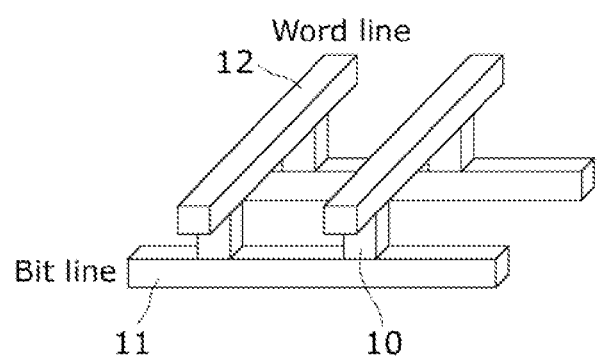
FIG. 3A shows a single-layer cross point structure according to Embodiment 1 of the present invention.
Figure 3B:
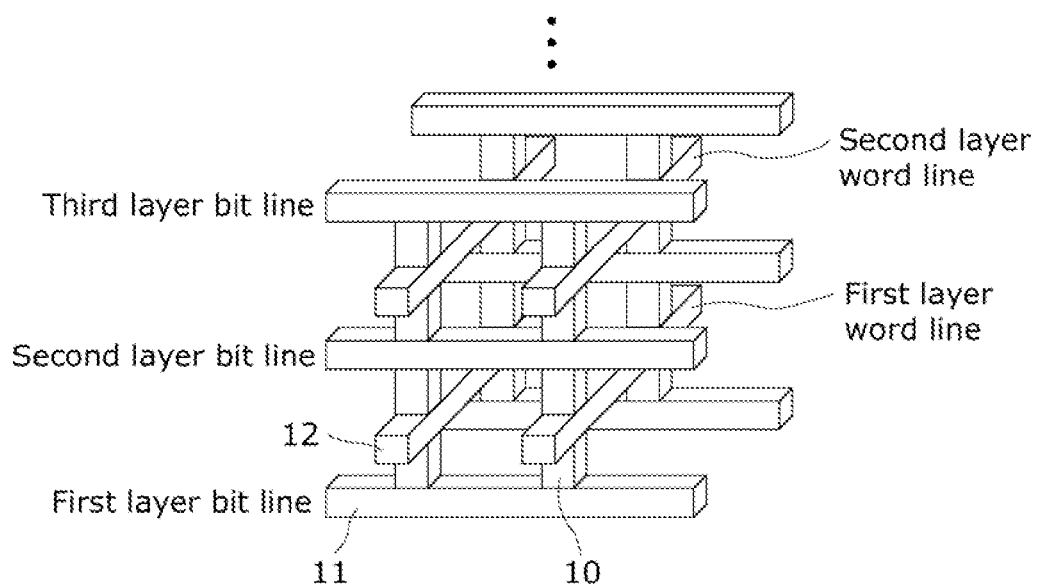
FIG. 3B shows a multilayer cross point structure according to Embodiment 1 of the present invention.

FIGS. 3A and 3B are conceptual diagrams showing three-dimensional structures including the memory cells 10. FIG. 3A shows the three-dimensional structure of so-called single-layer cross point memory cells. In this structure shown in FIG. 3A, memory cells 10 are provided at cross-points between bit lines 11 and word lines 12 that are orthogonally arranged, so as to be interposed between the bit lines 11 and the word lines 12.

FIG. 3B shows the three-dimensional structure of so-called multilayer cross point memory cells. In this structure shown in FIG. 36, the single-layer cross point memory cells in FIG. 3A are stacked.

Figure 4:
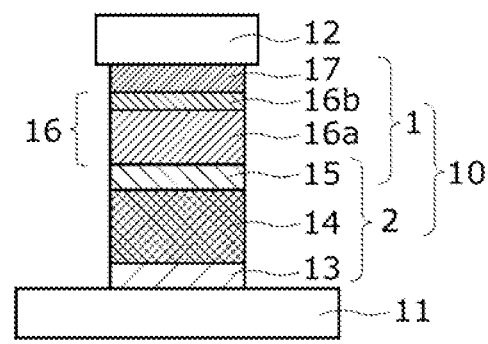
FIG. 4 is an example of a cross-sectional structure of a memory cell according to Embodiment 1 of the present invention.

FIG. 4 is a cross-section diagram showing the structure (structure corresponding to 1 bit) of the 1D1R memory cell 10 including the variable resistance element 1 according to Embodiment 1 of the present invention. As shown in FIG. 4, the 1D1R memory cell 10 normally includes the variable resistance element 1 and the current steering element 2.

Furthermore, as shown in FIG. 4, the variable resistance element 1 includes an internal electrode 15 (first electrode), a variable resistance layer 16, and an upper electrode 17 (second electrode). Here, the variable resistance layer 16 includes (i) a first transition metal oxide layer 16a comprising an oxygen-deficient transition metal oxide and (ii) a second transition metal oxide layer 16b comprising a transition metal oxide which is less than the oxygen-deficient transition metal oxide of the first transition metal oxide layer 16a in degree of oxygen deficiency. Furthermore, the first transition metal oxide layer 16a and the second transition metal oxide layer 16b are stacked. In the embodiments of the present invention, the same type of transition metal is used for both a first transition metal and a second transition metal, as an example. For example, an oxygen-deficient first tantalum oxide layer is used as the first transition metal oxide layer 16a, and a second tantalum oxide layer is used as the second transition metal oxide layer 16b.

Here, the degree of oxygen deficiency of the second tantalum oxide layer is less than that of the first tantalum oxide layer. In other words, the oxygen content atomic percentage of the second tantalum oxide layer is higher than that of the first tantalum oxide layer. The degree of oxygen deficiency is a ratio, in each transition metal, of an amount of deficient oxygen to the amount of oxygen included in the oxide having the stoichiometric composition of the transition metal. For example, when the transition metal is tantalum (Ta), the stoichiometric composition of the tantalum oxide is $Ta_2O_5$, and thus the stoichiometric composition of the tantalum oxide can be expressed as $TaO_{2.5}$. The degree of oxygen deficiency of $TaO_{2.5}$ is 0%. For example, the degree of oxygen deficiency of the oxygen-deficient tantalum oxide having the composition $TaO_{1.5}$ is (2.5−1.5)/2.5=40%. The oxygen content atomic percentage is a ratio of the number of atoms containing oxygen to the total number of atoms included in the transition metal oxide. The oxygen content atomic percentage of $Ta_2O_5$ is the ratio of the number of oxygen atoms to the total number of atoms (O/(Ta+O)), which equals 71.4 atm. %. Thus, the oxygen-deficient tantalum oxide has an oxygen content atomic percentage greater than 0 and less than 71.4 atm. %.

The resistance values of the memory cells just after manufacturing are very high, reflecting the resistance value of the second transition metal oxide layer 16b. After that, the resistance values of the memory cells decrease as the initial breakdown forms minute filaments (conduction paths) in the second transition metal oxide layer 16b.

The metal comprised in the variable resistance layer 16 may be a transition metal other than tantalum. The transition metal may be tantalum (Ta), titanium (Ti), hafnium (Hf), zirconium (Zr), niobium (Nb), tungsten (W), and so on. Since the transition metal can take a plurality of oxidation states, different resistance states can be achieved through a redox reaction. For example, in the case where a hafnium oxide is used for the variable resistance layer of the stack structure, it has been shown that the resistance value of the variable resistance layer 16 can be stably changed at high speed when a first hafnium oxide layer serving as the first transition metal oxide layer 16a has a composition $HfO_x$ where $0.9 \leq x \leq 1.6$ is satisfied and when a second hafnium oxide layer serving as the second transition metal oxide layer 16b has a composition $HfO_y$ where $x<y$ is satisfied. In this case, it is preferable that the thickness of the second hafnium oxide layer be 3 nm to 4 nm inclusive. Furthermore, in the case where a zirconium oxide is used, it has been shown that the resistance value of the variable resistance layer 16 can be stably changed at high speed when a first zirconium oxide layer serving as the first transition metal oxide layer 16a has a composition $ZrO_x$ where $0.9 \leq x \leq 1.4$ is satisfied and when a second zirconium oxide layer serving as the second transition metal oxide layer 16b has a composition $ZrO_y$ where $x<y$ is satisfied. In this case, it is preferable that the thickness of the second zirconium oxide layer be 1 nm to 5 nm inclusive.

Moreover, the variable resistance layer 16 may take a stack structure which includes the first transition metal oxide layer 16a comprising the first transition metal and the second transition metal oxide layer 16b comprising the second transition metal different from the first transition metal. The degree of oxygen deficiency of the second transition metal oxide layer 16b is less than that of the first transition metal oxide layer 16a. In other words, the resistance value of the second transition metal oxide layer 16b is greater than that of the first transition metal oxide layer 16a. With such a structure, voltage applied between the internal electrode 15 and the upper electrode 17 to bring about a change in resistance is allotted more to the second transition metal oxide layer 16b. This makes the redox reaction in the second transition metal oxide layer 16b occur more easily.

In the case of using different materials for the first transition metal and the second transition metal, the standard electrode potential of the second transition metal is preferably lower than that of the first transition metal. As the redox reaction occurs in minute filaments (conduction paths) formed in the second transition metal oxide layer 16b which is high in resistance, the resistance value of the second transition metal oxide layer 16b changes. This is because the redox reaction is considered to cause a resistance change phenomenon. For example, use of an oxygen-deficient tantalum oxide for the first transition metal oxide layer 16a and use of a titanium oxide ($TiO_2$) for the second transition metal oxide layer 16b enable a stable resistance change operation. Titanium (standard electrode potential=−1.63 eV) is a material whose standard electrode potential is lower than that of tantalum (standard electrode potential=−0.6 eV). Providing, as the second transition metal oxide layer 16b, a metal oxide whose standard electrode potential is lower than that of the first transition metal oxide layer 16a makes the redox reaction occur more easily in the second transition metal oxide layer 16b.

The resistance change phenomenon in the variable resistance film having the stack structure comprising the above materials is considered to occur as a result of a change in the resistance value of the minute filaments formed in the second transition metal oxide layer 16b which is high in resistance, caused by a redox reaction in the minute filaments. That is to say, when a positive voltage is applied to the upper electrode 17 on the second transition metal oxide layer 16b side with respect to the voltage at the internal electrode 15, the oxygen ions in the variable resistance layer 16 are drawn to the second transition metal oxide layer 16b side, causing an oxidation reaction in the minute filaments formed in the second transition metal oxide layer 16b. This oxidation reaction is considered to cause an increase in the resistance of the minute filaments. Conversely, when a negative voltage is applied to the upper electrode 17 on the second transition metal oxide layer 16b side with respect to the voltage at the internal electrode 15, the oxygen ions in the second transition metal oxide layer 16b are pushed away toward the first transition metal oxide layer 16a side, causing a reduction reaction in the minute filaments formed in the second transition metal oxide layer 16b. This reduction reaction is considered to cause a decrease in the resistance of the minute filaments.

For the upper electrode 17 connected to the second transition metal oxide layer 16b having a less degree of oxygen deficiency, it is possible to use, for example, platinum (Pt), iridium (Ir), palladium (Pd), Silver (Ag), nickel (Ni), tungsten (W), copper (Cu), and so on. Here, the upper electrode 17 comprises a material whose standard electrode potential is higher than that of the transition metal comprised in the second transition metal oxide layer 16b and that of the material comprised in the internal electrode 15. With such a structure, a stable resistance change phenomenon can be achieved through the oxidation reaction and the reduction reaction which selectively occur in the second transition metal oxide layer 16b near the interface between the upper electrode 17 and the second transition metal oxide layer 16b. The resistance change occurs more easily when there is a greater difference in standard electrode potential between the metal comprised in the electrode material and the metal comprised in the variable resistance layer, while the resistance change occurs less easily when the difference in standard electrode potential is smaller. Generally, the standard electrode potential is an index for susceptibility to oxidation, and a larger standard electrode potential means less susceptibility to oxidation, and a smaller standard electrode potential means greater susceptibility to oxidation. In particular, use of Pt and Ir having a high standard electrode potential is preferable because a favorable resistance change operation can be performed.

The current steering element 2 includes a lower electrode 13, a diode layer 14, and the internal electrode 15.

The current steering element 2 according to the present embodiment is an MSM diode, for example, including: the lower electrode 13 comprising a tantalum nitride; a semiconductor layer 14 comprising a nitrogen-deficient silicon nitride film whose nitrogen content atomic percentage is less than that of $Si_3N_4$; and the internal electrode 15 comprising a tantalum nitride. The semiconductor layer 14 may have a thickness of 3 nm to 20 nm inclusive, for example. The silicon nitride film can be given semiconductor characteristics by reducing its nitrogen content atomic percentage, thereby allowing the current steering element 2, which is an MSM diode, to be formed with a simplified manufacturing process. For example, the nitrogen-deficient silicon nitride film ($SiN_z$: $0<z<1.33$) can be formed by reactive sputtering in an atmosphere of a nitrogen gas, with Si used as the target, for example. At this time, it is sufficient to form the nitrogen-deficient silicon nitride film with a chamber pressure of 0.1 Pa to 1 Pa inclusive and an $Ar/N_4$ flow rate of 18 sccm/2 sccm, at ambient temperature.

Here, there is a problem with the characteristics of the above-described variable resistance element 1: the initial breakdown voltage varies among the variable resistance elements 1 included in the memory cell array; or there is an increase in the initial breakdown voltage initially applied to the variable resistance elements for a shift to a state in which the resistance change starts. Such problems can be solved by continuously applying voltage for a predetermined time period in the direction in which the resistance of the variable resistance element 1 increases. This is considered to be because upon application of the initial breakdown voltage in the direction in which the resistance increases, the memory cells in the high resistance state operate as protecting resistance even when breakdown is performed, whereas application of the initial breakdown voltage in the direction in which the resistance decreases causes excessive breakdown due to a rapid decrease in the resistance values of the memory cells, as well as causing the resistance values after the breakdown to vary.

Furthermore, the 1D1R memory cells have a problem, in addition to the above problem with the variable resistance element, that the reliability of the current steering element 2 decreases due to a flow of a large current in the current steering element 2 as a result of the resistance value of the variable resistance element 1 decreasing at the same time as the initial breakdown performed on the variable resistance element 1.

Figure 5:
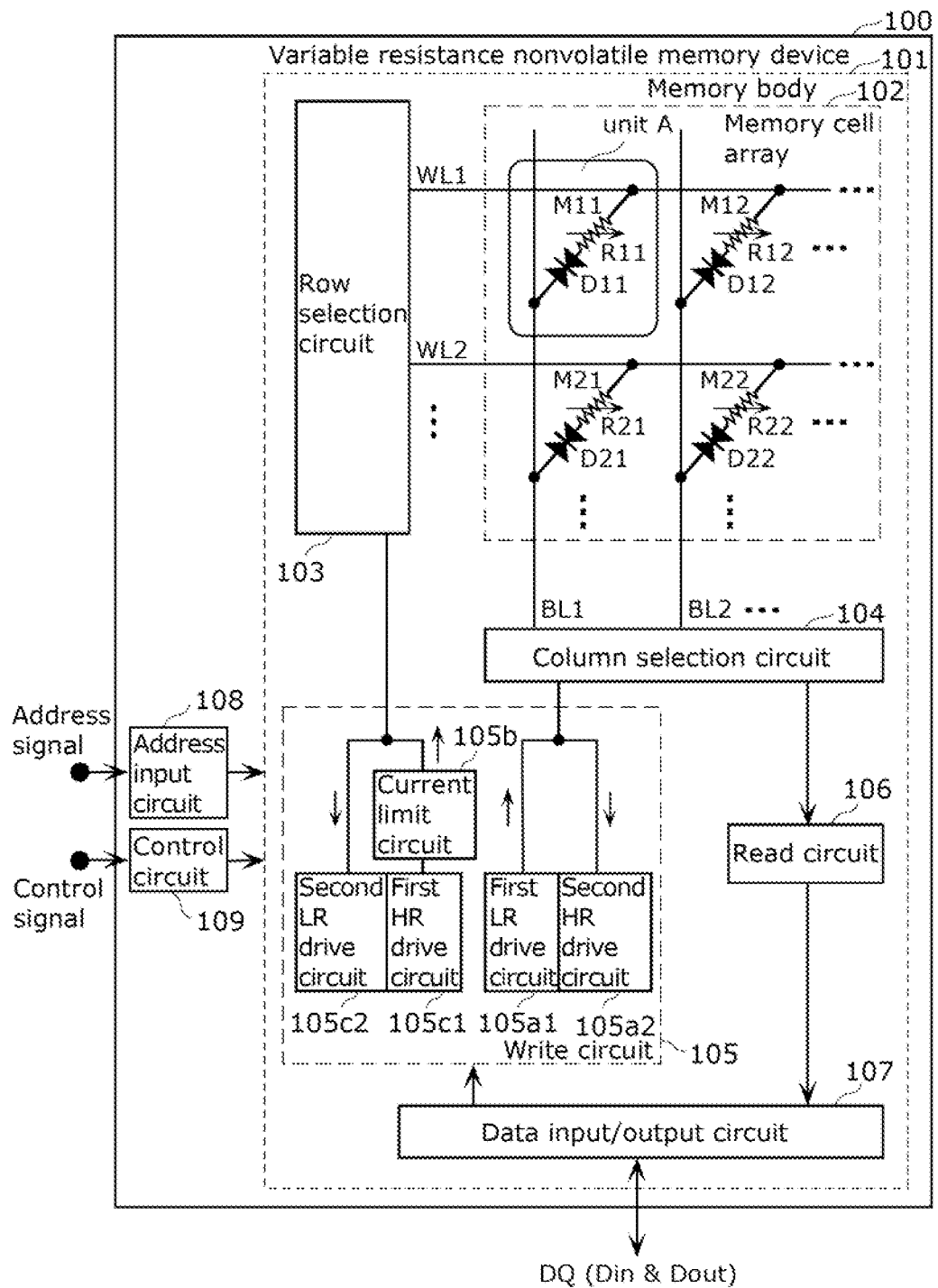
FIG. 5 shows a configuration of a variable resistance nonvolatile memory device according to Embodiment 1 of the present invention.

FIG. 5 is a block diagram showing a configuration of a variable resistance nonvolatile memory device 100 according to Embodiment 1 of the present invention.

The variable resistance nonvolatile memory device 100 shown in FIG. 5 includes a memory body 101 formed on a semiconductor substrate. The memory body 101 includes a memory cell array 102, a row selection circuit 103, a column selection circuit 104, a write circuit 105, a read circuit 106 which detects an amount of current flowing in a selected bit line, to determine whether stored data is "1" or "0", and a data input/output circuit 107 which inputs/outputs data via a terminal DQ.

The variable resistance nonvolatile memory device 100 further includes an address input circuit 108 and a control circuit 109. The address input circuit 108 receives an address signal from the outside of the variable resistance nonvolatile memory device 100 and instructs the memory body 101 to select an address indicated by the address signal. The control circuit 109 receives a control signal and controls the operation of the memory body 101 according to the control signal.

The memory cell array 102 includes a plurality of memory cells Mij (i and j are natural numbers satisfying i≤m and j≤n. The same applies to descriptions below.) arrayed in a matrix of m rows and n columns (m and n are natural numbers). Each memory cell Mij includes a variable resistance element Rij and a current steering element Dij having a threshold voltage in both the positive and negative directions. One terminal of the variable resistance element Rij and one terminal of the current steering element Dij having a threshold voltage in both the positive and negative directions are connected to each other. The other terminal of the variable resistance element Rij is connected to a word line WLi, and the other terminal of the current steering element Dij is connected to a bit line BLj.

In this configuration, the bit lines BLj are composed of lines of a lower layer and are arranged in the vertical direction of the sheet of the drawing. Furthermore, the word lines WLi are composed of lines of a layer upper than the bit lines BLj, and are arranged in the horizontal direction of the sheet of the drawing.

Here, the memory cells Mij, the variable resistance elements Rij, the current steering elements Dij, the bit lines BLj, and the word lines WLi respectively correspond to the memory cells 10, the variable resistance elements 1, the current steering elements 2, the bit lines 11, and the word lines 12 described above. For simplicity, FIG. 5 only shows two rows and two columns corresponding to 4 bits.

The word lines WLi are connected to the row selection circuit 103 which selects one row in the read or write mode. The bit lines BLj are connected to the column selection circuit 104 which selects one column in the read or write mode.

In the write mode, the data input/output circuit 107 performs low resistance writing or high resistance writing on the variable resistance element Rij of a selected memory cell Mij, according to a write instruction, indicated by the data input signal Din, to write data "0" or data "1". In the present embodiment, writing the data "0" corresponds to the low resistance writing, while writing the data "1" corresponds to the high resistance writing.

The write circuit 105 applies, to the memory cell Mij, a low resistance writing voltage greater than or equal to the first voltage via a corresponding bit line BLj and a corresponding word line WLi, to perform the low resistance writing by which the resistance state of the variable resistance element Rij is changed to the low resistance state. Likewise, the write circuit 105 applies, to the memory cell Mij, a high resistance writing voltage greater than or equal to the second voltage via the corresponding bit line BLj and the corresponding word line WLi, to perform the high resistance writing by which the resistance state of the variable resistance element Rij is changed to the high resistance state.

Furthermore, the write circuit 105 performs initial breakdown on the variable resistance element Rij by applying, via a corresponding bit line BLj and a corresponding word line WLi, an initial breakdown voltage to the variable resistance element Rij in its initial state after the variable resistance nonvolatile memory device 100 is manufactured. Here, the initial breakdown voltage is a voltage greater than the low resistance writing voltage and the high resistance writing voltage in absolute value and is a voltage of same polarity as that of the high resistance writing voltage. The initial breakdown is a process by which the initial state of the variable resistance element Rij changes to a state in which the resistance is variable through the low resistance writing and the high resistance writing.

The write circuit 105 is connected to the data input/output circuit 107. The write circuit 105 includes: a first LR drive circuit 105a1 which performs high level driving in the writing of the data "0", i.e., in the low resistance writing; and a second LR drive circuit 105c2 which performs low level driving in the writing of the data "0", i.e., in the low resistance writing. The write circuit 105 further includes: a first HR drive circuit 105c1 which performs high level driving in the writing of the data "1", i.e., in the high resistance writing; a current limit circuit 105b having an input terminal connected with the output terminal of the first HR drive circuit 105c1; and a second HR drive circuit 105a2 which performs low level driving in the writing of the data "1", i.e., in the high resistance writing.

The current limit circuit 105b is provided on the path of current flowing from the write circuit 105 to the plurality of memory cells Mij. Between current which flows in a first direction to change the resistance states of the memory cells Mij to the high resistance state and current which flows in a second direction to change the resistance states of the memory cells Mij to the low resistance state, the current limit circuit 105b limits only the current in the first direction.

One of the features of the variable resistance nonvolatile memory device 100 is to supply a signal having current limited by the current limit circuit 105b, from the first HR drive circuit 105c1 to the selected bit line BLj via the row selection circuit 103 when performing the initial breakdown operation on the variable resistance element Rij included in the memory cell Mij. That is to say, the current limit circuit 105b limits, in the initial breakdown, the current flowing in the first direction from the write circuit 105 to the memory cells Mij.

In the variable resistance nonvolatile memory device 100 thus configured, the bit lines BLj and the word lines WLi are examples of the first signal lines and the second signal lines according to an implementation of the present invention. Each of the first LR drive circuit 105a1, the first HR drive circuit 105c1, the second LR drive circuit 105c2, and the second HR drive circuit 105a2 is an example of the first drive circuit, the second drive circuit, the third drive circuit, and the fourth drive circuit according to an implementation of the present invention. The current limit circuit 105b is an example of the current limit circuit according to an implementation of the present invention. Furthermore, the column selection circuit 104 and the row selection circuit 103 are examples of the first selection circuit and the second selection circuit according to an implementation of the present invention.

Figure 6A:
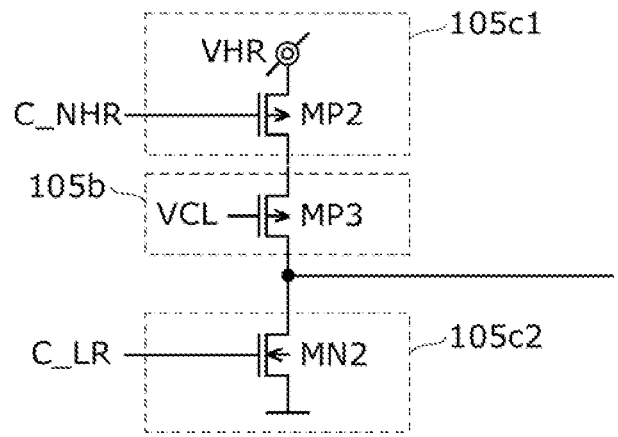
FIG. 6A is a circuit diagram of a current limit circuit, a first HR drive circuit, and a second LR drive circuit according to Embodiment 1 of the present invention.
Figure 6B:
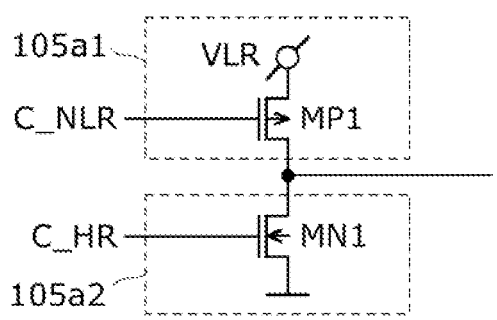
FIG. 6B is a circuit diagram of a first LR drive circuit, and a second HR drive circuit according to Embodiment 1 of the present invention.

FIGS. 6A and 6B show one example of a specific circuit configuration of the write circuit 105 in FIG. 5. FIG. 6A shows one example of the second LR drive circuit 105c2, the first HR drive circuit 105c1, and the current limit circuit 105b. FIG. 6B shows one example of the first LR drive circuit 105a1 and the second HR drive circuit 105a2.

The first HR drive circuit 105c1 includes a p-type MOS transistor MP2, the second LR drive circuit 105c2 includes an n-type MOS transistor MN2, the first LR drive circuit 105a1 includes a p-type MOS transistor MP1, and the second HR drive circuit 105a2 includes an n-type MOS transistor MN1. Furthermore, the current limit circuit 105b includes a p-type MOS transistor MP3.

When the initial breakdown operation is performed, a signal C_NHR and a signal C_LR are set at low level, and a signal C_NLR and a signal C_HR are set at high level. Furthermore, the source of the p-type MOS transistor MP2 is supplied with an initial breakdown voltage VHR in a direction in which the resistance increases. The PMOS transistor MP2 is configured in such a manner that it is capable of driving voltage and current that are sufficient for performing the initial breakdown on the variable resistance element Rij.

When the initial breakdown operation is performed, the p-type MOS transistor MP2 of the first HR drive circuit 105c1 and the n-type MOS transistor MN1 of the second HR drive circuit 105a2 are turned on by the signal C_NHR, the signal C_LR, the signal C_NLR, and the signal C_HR. Moreover, output current from the first HR drive circuit 105c1 flows into the second HR drive circuit 105a2 via a path including the current limit circuit 105b, the word line WLi, the memory cell Mij, and the bit line BLi. Furthermore, output current from the current limit circuit 105b is controlled by a gate input signal VCL supplied to the p-type MOS transistor MP3, in such a manner that the output current becomes current which is necessary for the initial breakdown of the variable resistance element 1 and which does not cause a decrease in the reliability of the current steering element 2.

Here, it is sufficient to control the gate input signal VCL supplied to the current limit circuit 105b, in such a manner that the current flowing in the variable resistance element becomes a current necessary for the initial breakdown when the initial breakdown is performed on the variable resistance element Rij. Thus, it is preferable to control the current limit value in the following manner: set the current limit value high immediately after the start of the initial breakdown operation so that the voltage at the word line WLi rises at high speed; and set the current limit value, by the time when the initial breakdown of the variable resistance element Rij starts, to such a value that the current flowing in the variable resistance element becomes current which is necessary for the initial breakdown of the variable resistance element Rij and which does not cause a decrease in the reliability of the current steering element 2.

Such control over the current limit value may be performed by detecting the voltage at the word line WLi. More specifically, the current limit circuit 105b may detect that the voltage at the word line WLi has reached a predetermined voltage, and change the value of the current to be limited, from a first current value to a second current value smaller than the first current value when detecting that the voltage at the word line WLi has reached the predetermined voltage.

Figure 7:
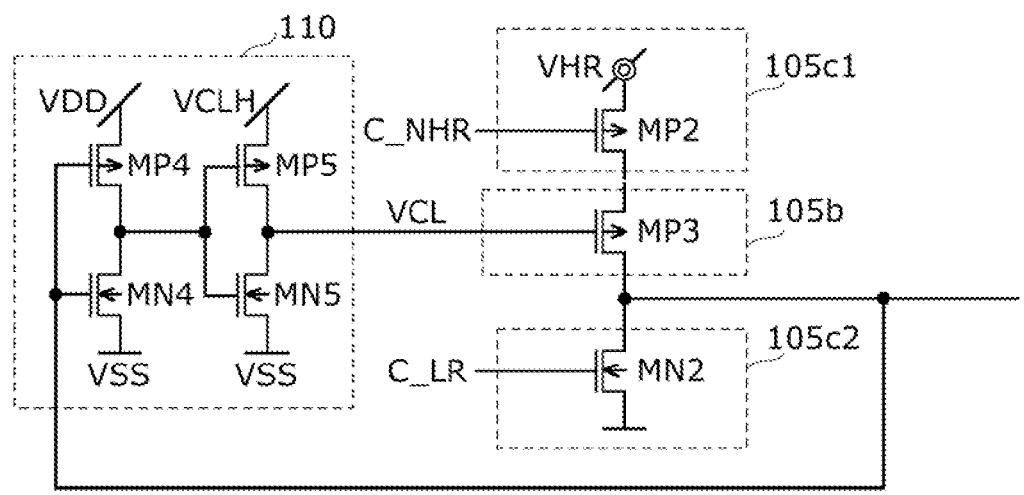
FIG. 7 is a circuit diagram of a current limit circuit and a control circuit according to Embodiment 1 of the present invention.

FIG. 7 shows an example of a circuit which detects the voltage at the word line WLi and controls the current limit value. In a control circuit 110, the output voltage of an inverter circuit including an NMOS transistor MN4 and a PMOS transistor MP4 is a power source voltage VDD until the voltage at the word line WLi reaches a threshold voltage of the inverter circuit. Thus, the gate of the current limit circuit 105b is supplied with the ground potential via the NMOS transistor MN5, thereby allowing the current limit circuit 105b to pass a large amount of current.

On the other hand, the inverter circuit outputs the output voltage of the ground level when the voltage at the word line WLi is greater than or equal to the threshold voltage of the inverter circuit. Thus, the voltage at the gate of the current limit circuit 105b rises to a voltage VCLH via the PMOS transistor MP5, thereby reducing the current passed by the current limit circuit 105b. It is possible to obtain an appropriate current limit value when the initial breakdown is performed on the variable resistance element as long as (i) the threshold voltage of the inverter circuit is set to a voltage necessary for the initial breakdown of the variable resistance element Rij and (ii) the value of current flowing in the PMOS transistor MP3 is set to such a value that does not reduce the reliability of the current steering element 2 when the voltage VCLH is applied to the gate input of the current limit circuit 105b.

Figure 8:
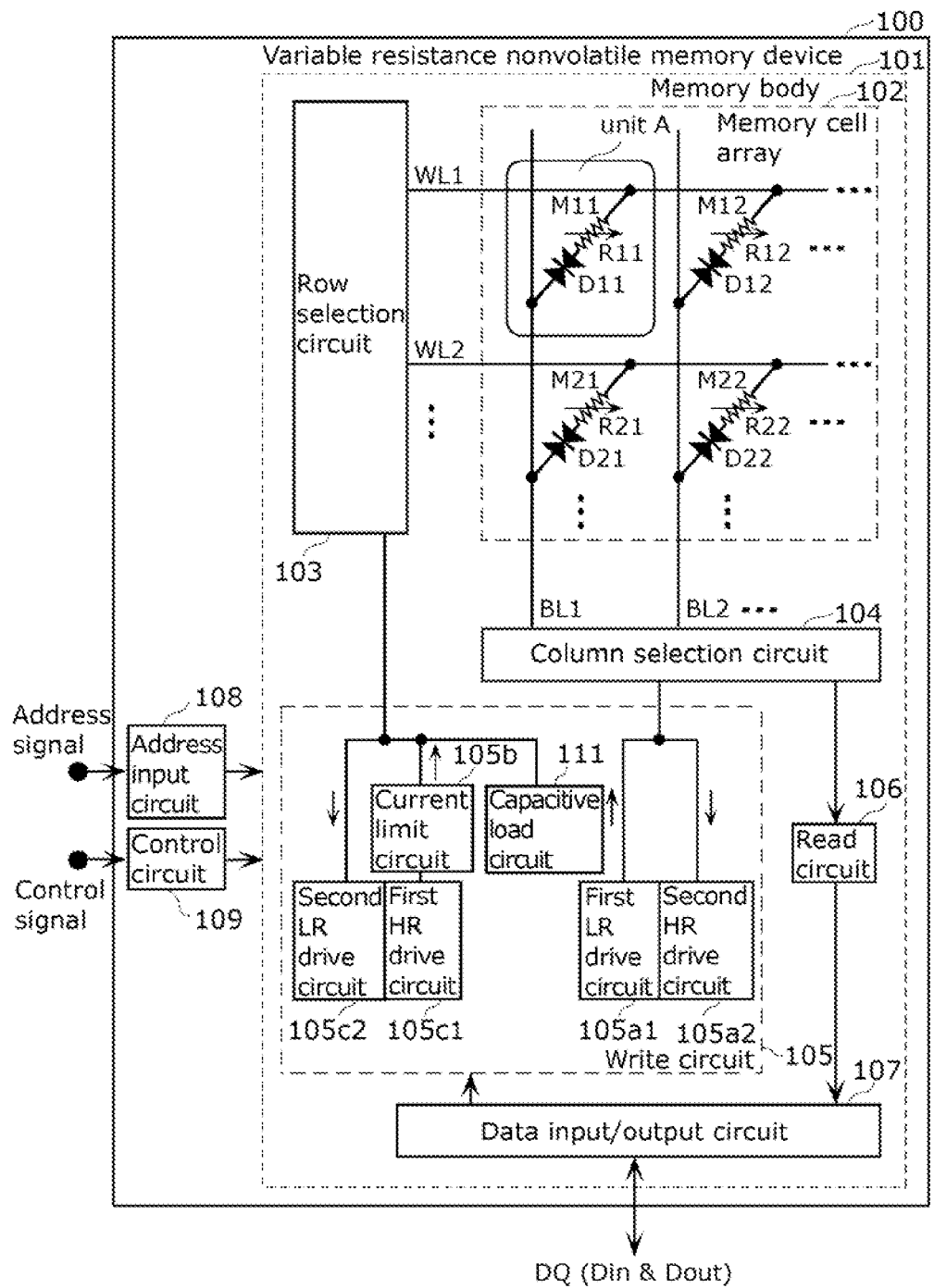
FIG. 8 shows a configuration of a variable resistance nonvolatile memory device including a capacitive load circuit according to Embodiment 1 of the present invention.

For a stable initial breakdown operation, the voltage at a selected word line WLi and a selected bit line B14 is preferably stable without fluctuations when the initial breakdown is performed on the variable resistance element Rij. This can be achieved by providing a capacitive load circuit 111 between the current limit circuit 105b and the row selection circuit 103 as shown in FIG. 8.

Figure 9:
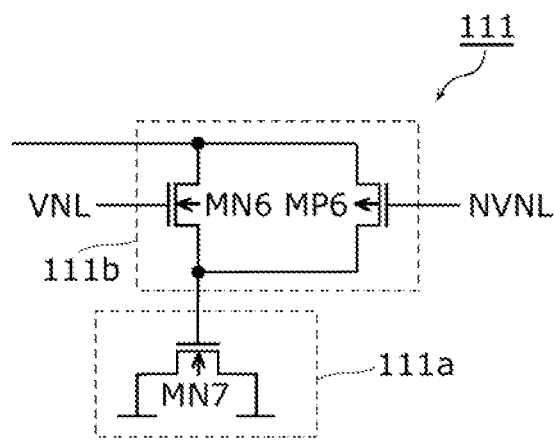
FIG. 9 is a circuit diagram of a capacitive load circuit according to Embodiment 1 of the present invention.

FIG. 9 shows an example of the capacitive load circuit 111. As shown in FIG. 9, the capacitive load circuit 111 includes: a selection switch 111b including an NMOS transistor MN6 and a PMOS transistor MP6; and a capacitive load element 111a connected to the output terminal of the current limit circuit 105b via the selection switch 111b.

The selection switch 111b turns on and off the connection between the capacitive load element 111a and a node between the current limit circuit 105b and the row selection circuit 103.

At the time of the initial breakdown operation, it is sufficient to connect the capacitive load element 111a to the output terminal of the current limit circuit 105b by setting a gate input signal VNL supplied to the NMOS transistor MN6 to the power source potential and setting a gate input signal NVNL supplied to the PMOS transistor MP6 to the ground potential.

Note that instead of providing the capacitive load circuit 111, the read circuit 106 may be used as the capacitive load circuit in the configuration shown in FIG. 5, by activating the read circuit 106 at the time of the initial breakdown operation.

Figure 10:
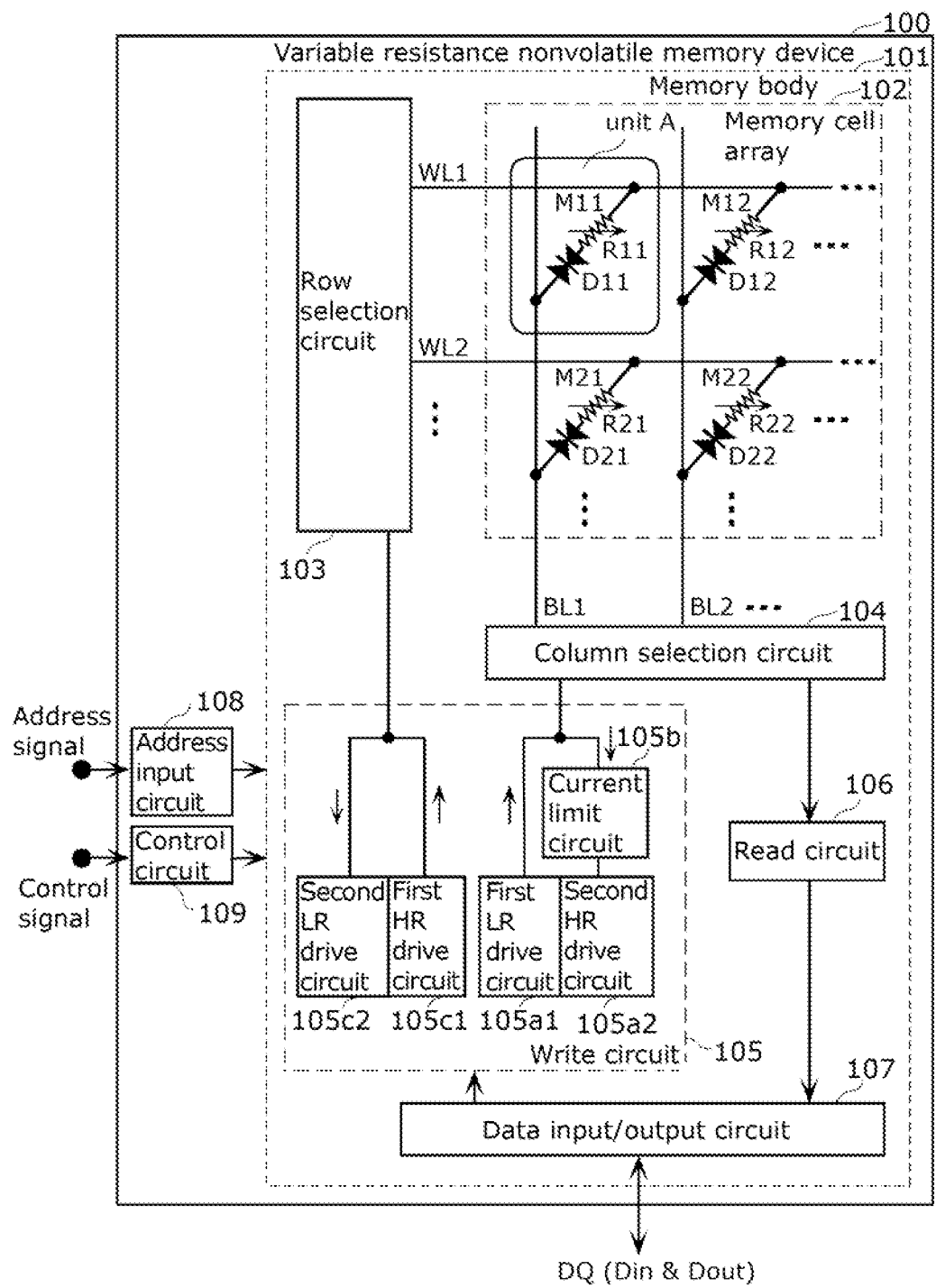
FIG. 10 shows a configuration of a variable resistance nonvolatile memory device according to a variation of Embodiment 1 of the present invention.
Figure 11A:
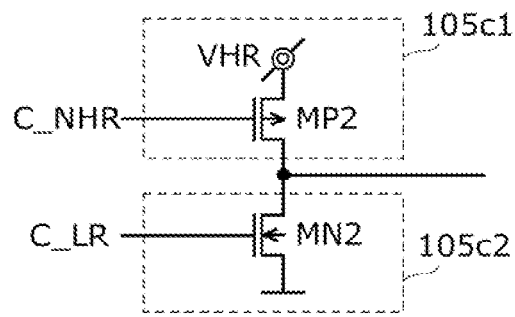
FIG. 11A is a circuit diagram of a first HR drive circuit; and a second LR drive circuit according to a variation of Embodiment 1 of the present invention.
Figure 11B:
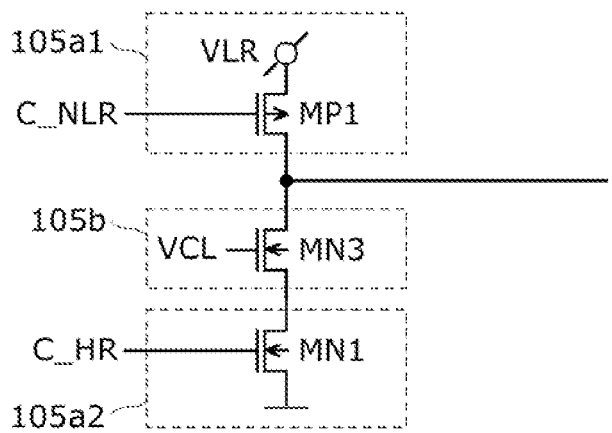
FIG. 11B is a circuit diagram of a current limit circuit, a first LR drive circuit, and a second HR drive circuit according to a variation of Embodiment 1 of the present invention.
Figure 12:
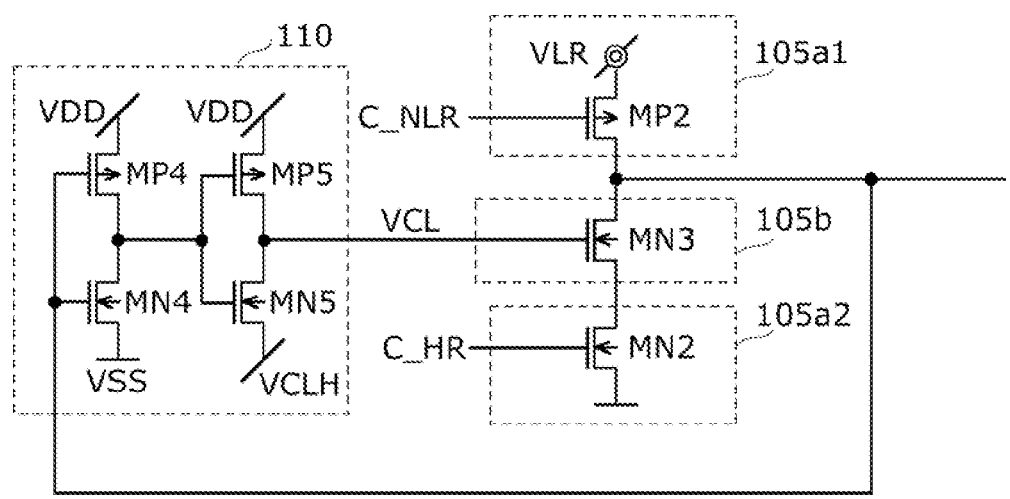
FIG. 12 is a circuit diagram of a current limit circuit and a control circuit according to a variation of Embodiment 1 of the present invention.

Furthermore, the current limit circuit 105b may be provided on the second HR drive circuit 105a2 side rather than on the first HR drive circuit 105c1 side. FIG. 10 shows a configuration of the variable resistance nonvolatile memory device 100 according to a variation of Embodiment 1. FIGS. 11A and 11B show an example of a specific circuit configuration of the write circuit 105 shown in FIG. 10. As shown in FIG. 11B, the current limit circuit 105b includes an n-type MOS transistor MN3. FIG. 12 shows the control circuit 110 which controls the current limit value of the current limit circuit 105b shown in FIG. 11. In this case, the control circuit 110 detects the voltage at the bit line BLj to perform the control. More specifically, the current limit circuit 105b may detect that the voltage at the bit line BLj has reached a predetermined voltage, and change the value of the current to be limited, from the first current value to the second current value smaller than the first current value when detecting that the voltage at the bit line BLj has reached the predetermined voltage.

Next, referring to the timing chart shown in FIG. 13A, the following describes an example of operation performed in the case where the initial breakdown operation is performed on the memory cell Mij of the variable resistance nonvolatile memory device 100 according to Embodiment 1.

FIG. 13A is a timing chart showing an example of operation of the variable resistance nonvolatile memory device 100 according to Embodiment 1 of the present invention. The following describes only the case where a memory cell M11 is selected and the initial breakdown operation is performed on the memory cell M11. When the memory cell M11 is the selected memory cell, a memory cell M12 is an unselected memory cell with a selected potential in the word line and an unselected potential in the bit line. A memory cell M21 is an unselected memory cell with an unselected potential in the word line and a selected potential in the bit line. A memory cell M22 is an unselected memory cell with a selected potential in both the word line and the bit line.

FIG. 13A also shows, in addition to current flowing in the memory cell M11 that is a selected memory cell, current flowing in the memory cells M12, M21, and M22 that are unselected memory cells. As for the current waveforms, the current flowing in the direction from the word line WLi to the bit line BLj, that is, in the direction from the upper electrode 17 to the internal electrode 15 of the variable resistance element Rij, is current of the positive polarity.

Hereinafter, referring to FIG. 13A, operations performed in periods T1 to T4 will be described. Note that in FIG. 13A, VDD corresponds to the power supply voltage supplied to the variable resistance nonvolatile memory device 100.

In a period T1 of the cycle of performing the initial breakdown operation on the memory cell M11 shown in FIG. 13A, all the word lines (WL1 and WL2) are pre-charged with a voltage VPR_WL, and all the bit lines (BL1 and BL2) are pre-charged with a voltage VPR_BL. Note that each pre-charge voltage is a voltage approximately intermediate of the maximum amplitude of the word lines and the bit lines.

In the period T2 following the period T1, a variable resistance element R11 is in the initial state. The row selection circuit 103 selects a word line WL1 and the column selection circuit 104 selects a bit line BL1. The first HR drive circuit 105c1 drives the selected word line WL1 to have the voltage VHR and the second HR drive circuit 105a2 drives the selected bit line BL1 to have 0 V. In the periods T2 and T3, the gate input signal VCL supplied to the p-type MOS transistor MP3 included in the current limit circuit 105b has the voltage VCLH. With this, the current flowing in the memory cell M11 is limited in the periods T2 and T3.

With the above operation, the potential at the selected word line WL1 rises and the potential at the selected bit line BL1 drops over time in the period T2. Here, the potential at the bit line BL1 drops relatively fast, whereas the potential at the word line WL1 driven via the current limit circuit 105b rises gradually.

In the period T3, the initial breakdown in performed on the variable resistance element, and the value of current flowing in the memory cell M11 increases. Furthermore, the voltage necessary for the initial breakdown of the variable resistance element is applied to the upper electrode 17 of the variable resistance element R11 with respect to the voltage at the lower electrode (internal electrode) 15. After a lapse of a predetermined time period, the initial breakdown is performed on the variable resistance element R11.

Along with the initial breakdown of the variable resistance element R11, the current flowing in the memory cell M11 increases. However, the current value does not reach or exceed a set value due to the current limit circuit 105b as described earlier. This prevents reduction in the reliability of the diode.

In the following period T4, the selection of the word line WL1 and the bit line BL1 is reset. Then, all the word lines are pre-charged with the voltage VPR_WL while all the bit lines are pre-charged with the voltage VPR_BL. With this, the initial breakdown operation on the memory cell M11 finishes.

FIG. 13B is a timing chart showing another example of operation of the variable resistance nonvolatile memory device 100 according to Embodiment 1 of the present invention. In FIG. 13B, the voltage of the signal VCL is not the voltage VCLH from the start of the period T2 but is a voltage VCLL lower than the voltage VCLH in the period T5, and is the voltage VCLH during the period T6 which starts partway in the period T2 and finishes at the end of the period T3.

In such a manner, by increasing the current limit value of the current limit circuit 105b in the period 15 in which the word line WL1 starts to be driven, it is possible to reduce the time that elapses before the voltage at the selected word line WL1 reaches the voltage VHR.

Here, it is sufficient as long as the period T5 in which the current limit value of the current limit circuit 105b is large is a period which comes after the supply of the initial breakdown voltage to the selected memory cell starts and before the initial breakdown is performed on the selected memory cell. Furthermore, it is sufficient as long as the period T6 in which the current limit value of the current limit circuit 105b is small is a period which follows the period T5 and includes the time at which the initial breakdown is performed on the selected memory cell.

Furthermore, the signal VCL shown in FIG. 13B is automatically generated by the control circuit 110 shown in FIG. 7 described earlier. Note that the signal VCL may be generated according to predetermined timing.

In the above-described manner, the variable resistance nonvolatile memory device 100 according to Embodiment 1 of the present invention limits the current flowing in the path from the write circuit 105 to the memory cell at the time of the initial breakdown. This makes it possible for the variable resistance nonvolatile memory device 100 to perform the initial breakdown on the variable resistance element Rij without compromising the reliability of the current steering element Dij in the 1D1R cross point memory.

Embodiment 2

As the initial breakdown of the memory cells proceeds, the resistance value of the variable resistance element Rij decreases, causing an increase in leak current to unselected memory cells. The inventors have found a problem that such an increase in leak current results in a drop in the voltage at the word line WLi and a rise in the voltage at the bit line BLi, thereby making the initial breakdown difficult. This problem can be solved by devising the order in which the initial breakdown is performed on the memory cells of the memory cell array 102.

FIG. 14 shows a configuration of the variable resistance nonvolatile memory device 100 according to Embodiment 2 of the present invention. Note that FIG. 14 only shows: a part of the memory cell array 102 that is a matrix of m rows and n columns; the row selection circuit 103; the column selection circuit 104; the write circuit 105; and the read circuit 106. The structural elements other than those just mentioned are the same as the structural elements in FIG. 5, for example.

As shown in FIG. 14, the memory cell array 102 is divided into a plurality of blocks 120-1 to 120-x. Each block includes memory cells of 2 rows and 16 columns. Note that the number of memory cells included in each block is not limited to this example.

For simplicity, the following describes an operation performed on the memory cells of 2 rows and n columns included in the memory cell array 102.

According to Embodiment 2 of the present invention, the write circuit 105 first performs the initial breakdown on a plurality of memory cells included in a block 120-x that is farthest from the row selection circuit 103. When the initial breakdown of the memory cells included in the block 120-x is finished, the write circuit 105 performs the initial breakdown on memory cells included in a block 120-x-1. Similarly, the write circuit 105 sequentially performs the initial breakdown on memory cells included in a block that is adjacent to the block for which the initial breakdown has finished and that is closer to the row selection circuit 103. Lastly, the write circuit 105 performs the initial breakdown on memory cells included in the block 120-1.

In the array for which the initial breakdown has finished, the resistance values of the variable resistance elements decrease, thereby increasing the leak current. However, by performing the initial breakdown in the above manner, the memory cells for which the initial breakdown has finished are located away from the row selection circuit 103, i.e., away from the write circuit 105, and are thus less susceptible to the drop in the voltage at the word line caused by the increased leak current. This makes it possible to perform stable initial breakdown on the selected memory cell.

In such a manner, according to Embodiment 2 of the present invention, the write circuit 105 sequentially selects blocks in an order starting from a block far from the row selection circuit 103 and finishing with a block close to the row selection circuit 103, and performs, for each of the selected blocks, the initial breakdown on each memory cell included in the selected block. This means that the order in which the write circuit 105 selects blocks is the blocks 120-x, 120-x-1, ..., 120-2, and 120-1.

More specifically, to perform the initial breakdown on the memory cells in the block 120-x, the write circuit 105 first applies the initial breakdown voltage to the word line WL1 and the bit line BLn, and performs the initial breakdown on a memory cell provided at the cross-point of the word line WL1 and the bit line BLn. Next, the write circuit 105 applies the initial breakdown voltage to WL2 and BLn, WL1 and BLn-1, and WL2 and BLn-1 in this order, and performs the initial breakdown on memory cells each provided at one of the cross-points of the word lines and the bit lines. That is to say, for each of the selected blocks, the write circuit 105 sequentially selects memory cells from among the memory cells included in the selected block, in an order starting from the memory cell farthest from the row selection circuit 103 and finishing with the memory cell closest to the row selection circuit 103, and performs the initial breakdown on each of the selected memory cells.

Note that the order in which the initial breakdown voltage is applied may be reversed. That is to say, instead of applying the initial breakdown voltage to WL2 and BLn, and then to WL1 and BLn-1, the initial breakdown voltage may be applied to WL1 and BLn-1 and then to WL2 and BLn.

The initial breakdown is performed on the blocks 120-*x*-1, . . . , 120-2, and 120-1 with the same procedure as that for the block 120-*x* described above.

The above description has shown the case where the write circuit 105 sequentially selects blocks in an order starting from a block far from the row selection circuit 103 and finishing with a block close to the row selection circuit 103. However, instead of this, the write circuit 105 may sequentially select blocks in an order starting from a block far from the column selection circuit 104 and finishing with a block close to the column selection circuit 104, and may perform, for each of the selected blocks, the initial breakdown on each memory cell included in the selected block.

Note that since the memory cell array 102 includes a plurality of memory cells arrayed in a matrix of m rows and n columns, the actual block selection is complicated.

Figure 15:
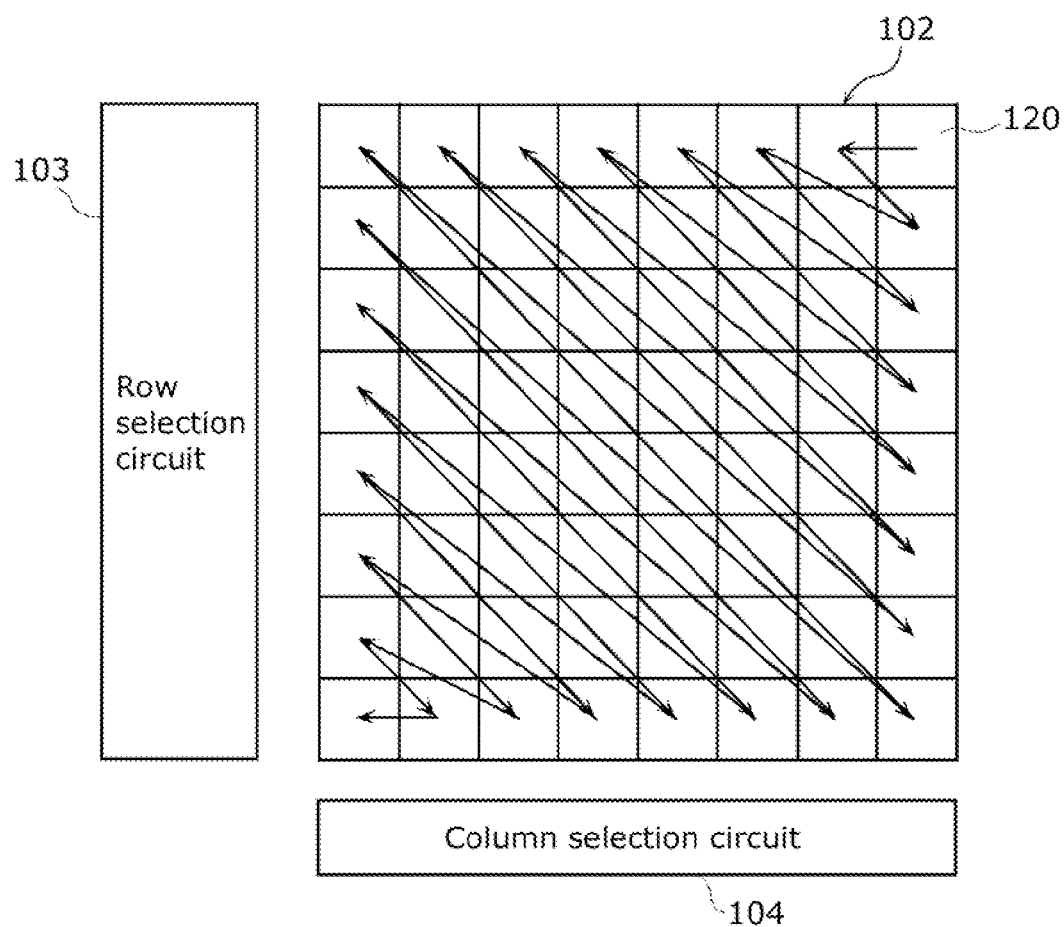
FIG. 15 shows an order in which blocks are selected according to Embodiment 2 of the present invention.

For example, the blocks may be selected in the order shown in FIG. 15. FIG. 15 shows a case where the number of blocks is 8×8=64. As shown in FIG. 15, the write circuit 105 may sequentially select blocks in a zigzag manner in the order (i) starting from a block (the block at the upper right corner of the memory cell array 102 in FIG. 15) which includes a memory cell provided at the cross-point of the uppermost one of the word lines (the word line farthest from the column selection circuit 104) and the rightmost one of the bit lines (the bit line farthest from the row selection circuit 103) and (ii) finishing with a block (the block at the down left corner in FIG. 15) which includes a memory cell provided at the cross-point of the lowermost one of the word lines and the leftmost one of the bit lines.

Figure 16:
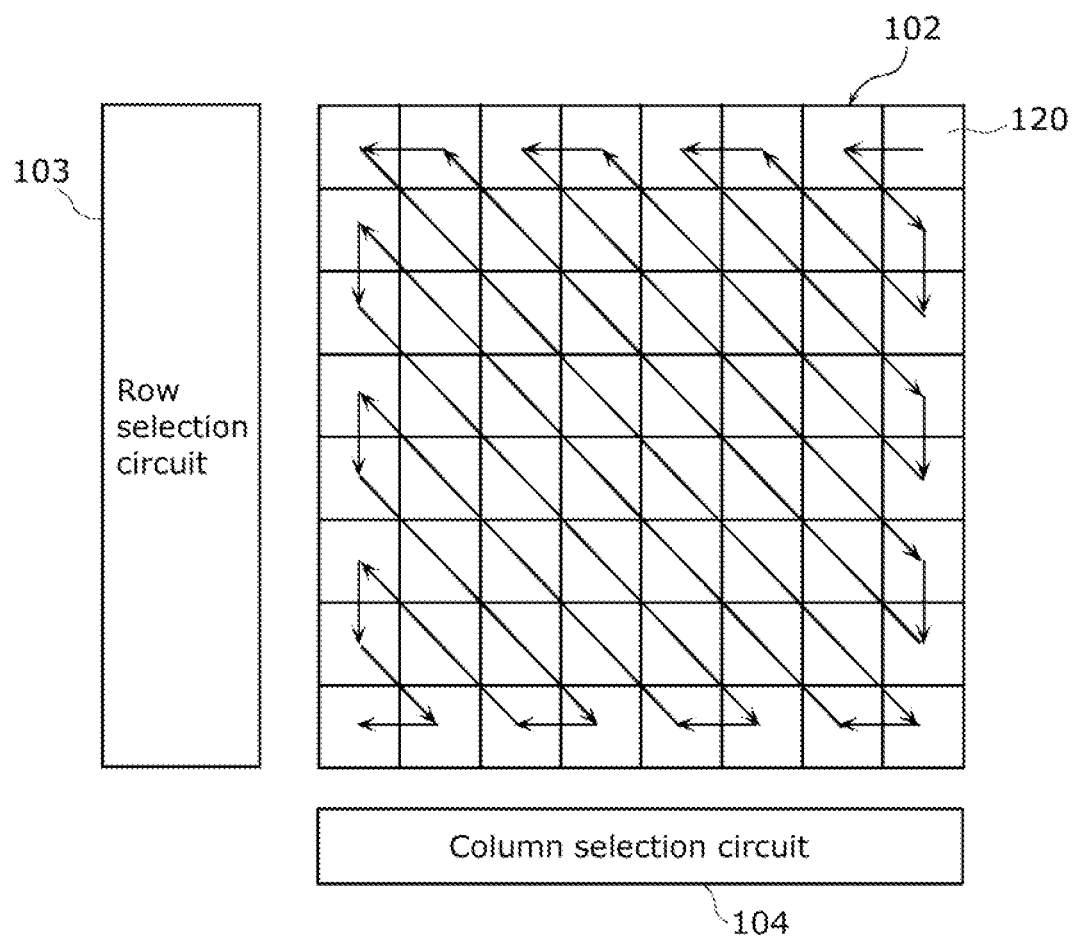
FIG. 16 shows an order in which blocks are selected according to Embodiment 2 of the present invention.

Furthermore, the write circuit 105 may select the blocks in a zigzag manner in the order shown in FIG. 16. Moreover, the write circuit 105 may select the blocks in a zigzag manner in an order other than the orders shown in FIG. 15 and FIG. 16. For example, although FIG. 15 and FIG. 16 show that a left block and a diagonally down right block are selected in this order, instead, a lower block and a diagonally upper left block may be selected in this order.

Figure 17:
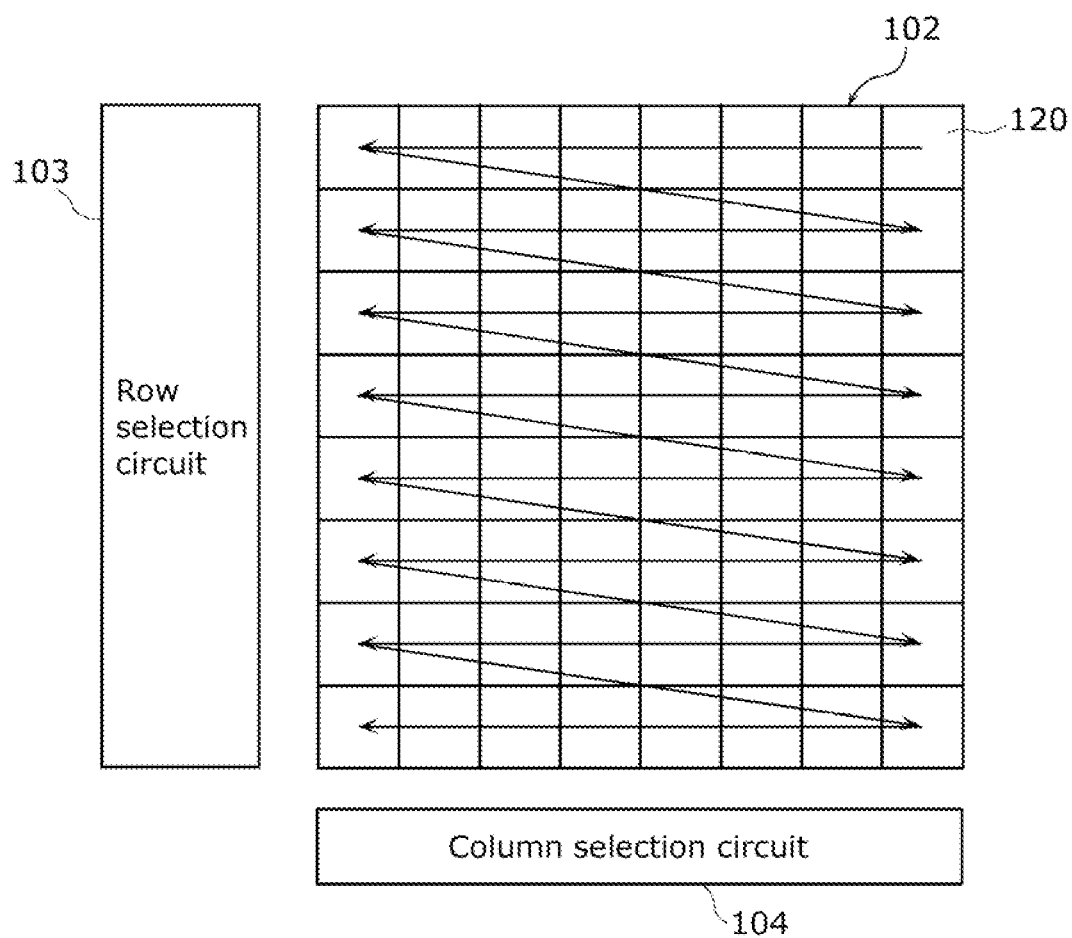
FIG. 17 shows an order in which blocks are selected according to Embodiment 2 of the present invention.

Furthermore, as shown in FIG. 17, the write circuit 105 may (i) sequentially select rows of blocks in an order starting from the row farthest from the column selection circuit 104 (the uppermost row in FIG. 17) and finishing with the row closest to the column selection circuit 104 (the lowermost row in FIG. 17), and (ii) for each of the selected rows, sequentially select blocks from among the blocks arrayed in the selected row, in an order starting from the block farthest from the row selection circuit 103 (the rightmost block in FIG. 17) and finishing with the block closest to the row selection circuit 103 (the leftmost block in FIG. 17). To put it differently, the write circuit 105 may (i) sequentially select word lines in an order starting from the word line farthest from the column selection circuit 104 (the uppermost word line in FIG. 17) and finishing with the word line closest to the column selection circuit 104 (the lowermost word line in FIG. 17), and (ii) for each of the selected word lines, sequentially select blocks from among the blocks corresponding to the selected word signal line, in an order starting from the block farthest from the row selection circuit 103 (the rightmost block in FIG. 17) and finishing with the block closest to the row selection circuit 103 (the leftmost block in FIG. 17).

Figure 18:
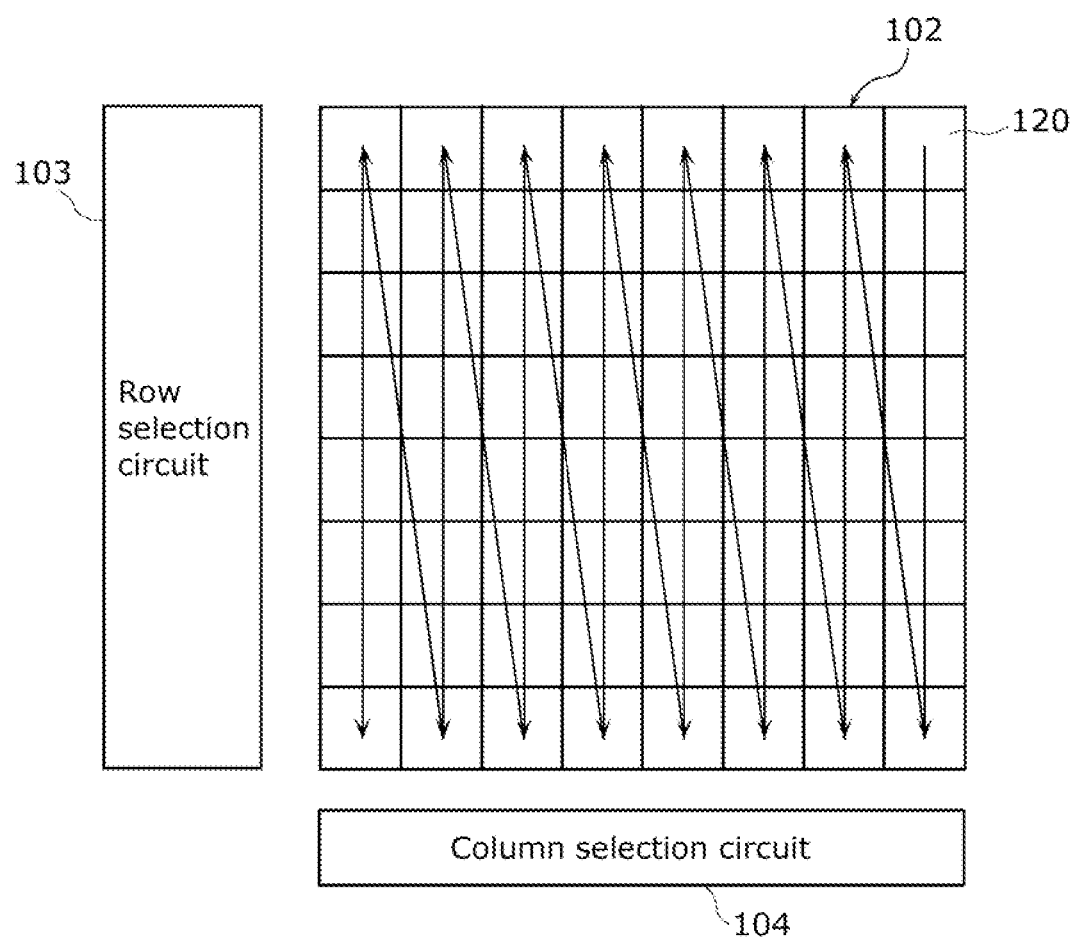
FIG. 18 shows an order in which blocks are selected according to Embodiment 2 of the present invention.

Moreover, as shown in FIG. 18, the write circuit 105 may (i) sequentially select columns of blocks in an order starting from the column farthest from the row selection circuit 103 (the rightmost column in FIG. 18) and finishing with the column closest to the row selection circuit 103 (the leftmost column in FIG. 18), and (ii) for each of the selected columns, sequentially select blocks from among the blocks arrayed in the selected column, in an order starting from the block farthest from the column selection circuit 104 (the uppermost block in FIG. 18) and finishing with the block closest to the column selection circuit 104 (the lowermost block in FIG. 18). To put it differently, the write circuit 105 may (i) sequentially select bit lines in an order starting from the bit line farthest from the row selection circuit 103 (the rightmost bit line in FIG. 18) and finishing with the bit line closest to the row selection circuit 103 (the leftmost bit line in FIG. 18), and (ii) for each of the selected bit lines, sequentially select blocks from among the blocks corresponding to the selected bit signal line, in an order starting from the block farthest from the column selection circuit 104 (the uppermost block in FIG. 18) and finishing with the block closest to the column selection circuit 104 (the lowermost block in FIG. 18).

In other words, the blocks are arrayed in rows and columns. The write circuit 105 sequentially selects lines from among a plurality of lines which are either rows or columns of blocks and are in parallel to first signal lines (one of the bit lines and the word lines), in an order starting from the line farthest from a second selection circuit (one of the column selection circuit 104 and the row selection circuit 103) which selects second signal lines (the other of the bit lines and the word lines) and finishing with the line closest to the second selection circuit. Then, for each of the selected lines, the write circuit 105 sequentially selects blocks from among the blocks arrayed in the selected line, in an order starting from the block farthest from a first selection circuit (the other of the column selection circuit 104 and the row selection circuit 103) which selects the first signal lines (the one of the bit lines and the word lines) and finishing with the block closest to the first selection circuit.

Although FIG. 15 to FIG. 18 show examples in which the memory cell array has m rows and n columns where m equals n, the number of rows m and the number of columns n may be different from each other. For example, when the number of columns n is greater than the number of rows m, it is preferable to sequentially select blocks in an order starting from a block far from the voltage supply side and finishing with a block close to the voltage supply side at least in the row direction (the direction in parallel to the word lines, i.e., the horizontal direction in FIG. 15 to FIG. 18). Furthermore, when the number of rows m is greater than the number of columns n, it is preferable to sequentially select blocks in an order starting from a block far from the voltage supply side and finishing with a block close to the voltage supply side at least in the column direction (the direction in parallel to the bit lines, i.e., the vertical direction in FIG. 15 to FIG. 18).

In any of the cases shown in FIG. 15 to FIG. 18, (i) blocks are sequentially selected for each word line in an order starting from a block far from the word lines' voltage supply side and finishing with a block close to the word lines' voltage supply side and (ii) blocks are sequentially selected for each bit line in an order starting from a block far from the bit lines' voltage supply side and finishing with a block close to the bit lines' voltage supply side.

Although the write circuit 105 performs the selection on a block-by-block basis in the above description, it may perform the selection on a memory cell-by-memory cell basis.

Moreover, although the write circuit 105 applies the breakdown voltage on one end of the word lines and the bit lines in the above description, it may apply the breakdown voltage on two or more points. In other words, two row selection circuits 103 may be provided on the right and left of the memory cell array 102 so that the memory cell array 102 is interposed between the two row selection circuits 103. This means that the write circuit 105 applies the breakdown voltage on both ends of the word lines via the two row selection circuits 103. In this case, it is sufficient for the write circuit 105 to sequentially select blocks in the order (i) starting from the block which is in the middle in the horizontal direction of the memory cell array 102 (a block far from both of the two row selection circuits 103) and (ii) finishing with the blocks at both ends (blocks each close to one of the two row selection circuits 103). Similarly, two column selection circuits 104 may be provided at the top and bottom of the memory cell array 102 so that the memory cell array 102 is interposed between the two column selection circuits 104.

The following describes a variation of Embodiment 2 of the present invention.

According to this variation, it is possible to completely eliminate the adverse effect of the leak current by disconnecting a memory cell for which the initial breakdown has finished.

Figure 19:
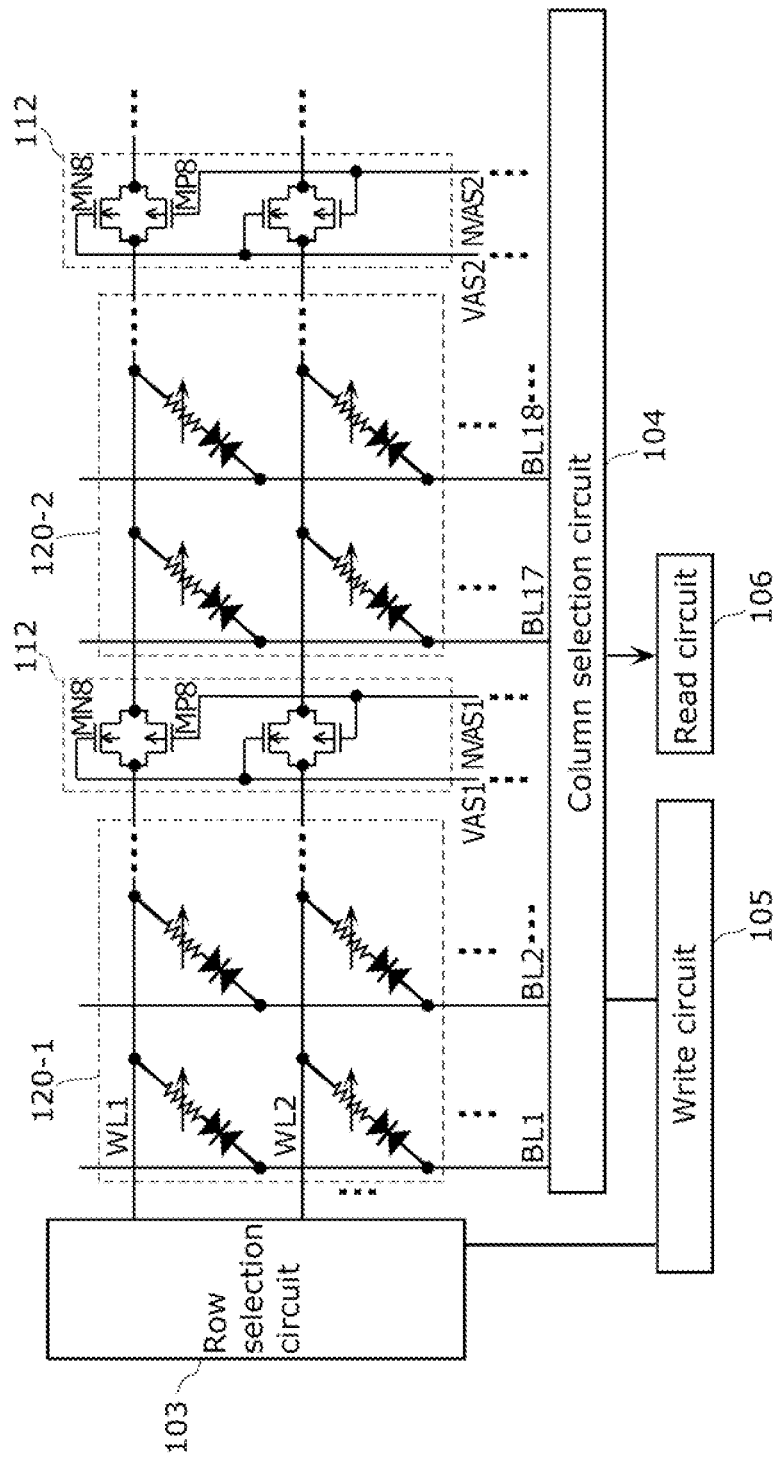
FIG. 19 shows a configuration of a memory cell array according to a variation of Embodiment 2 of the present invention.
Figure 20:
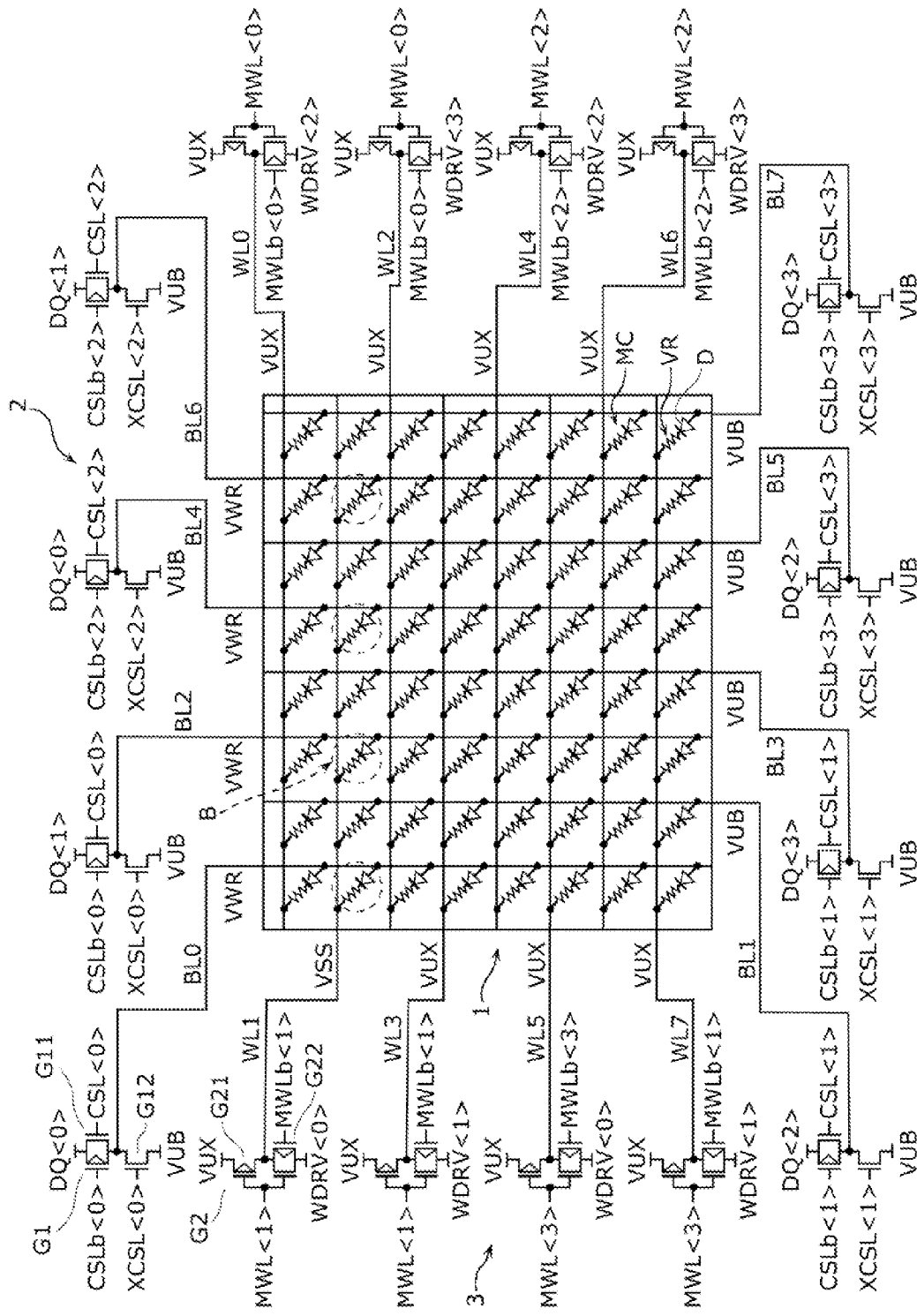
FIG. 20 is a circuit diagram of a conventional memory cell array and the peripherals thereof.
Figure 21:
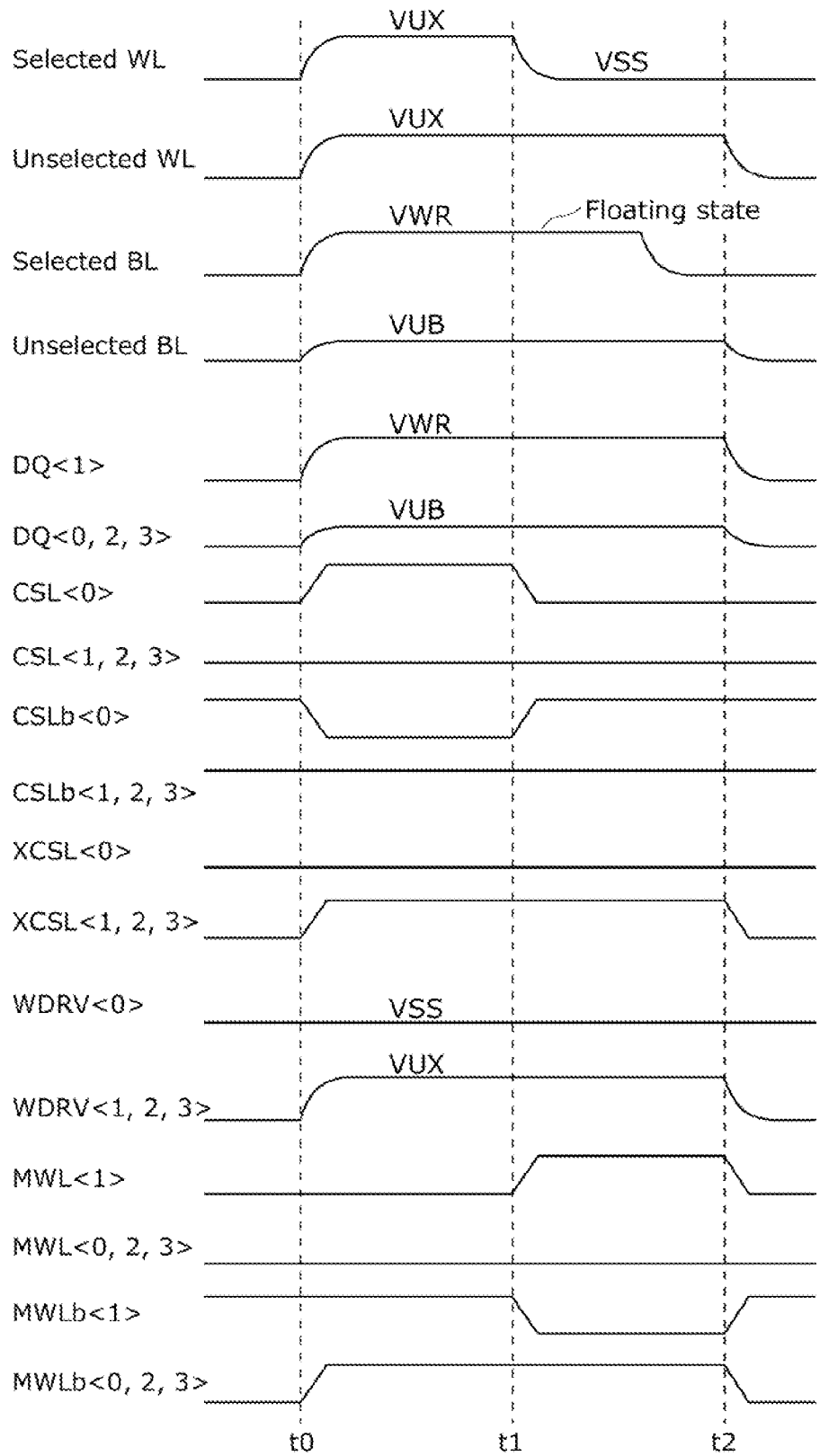
FIG. 21 shows voltage waveforms of units included in a circuit of a conventional memory cell array and the peripherals thereof.
Figure 22:
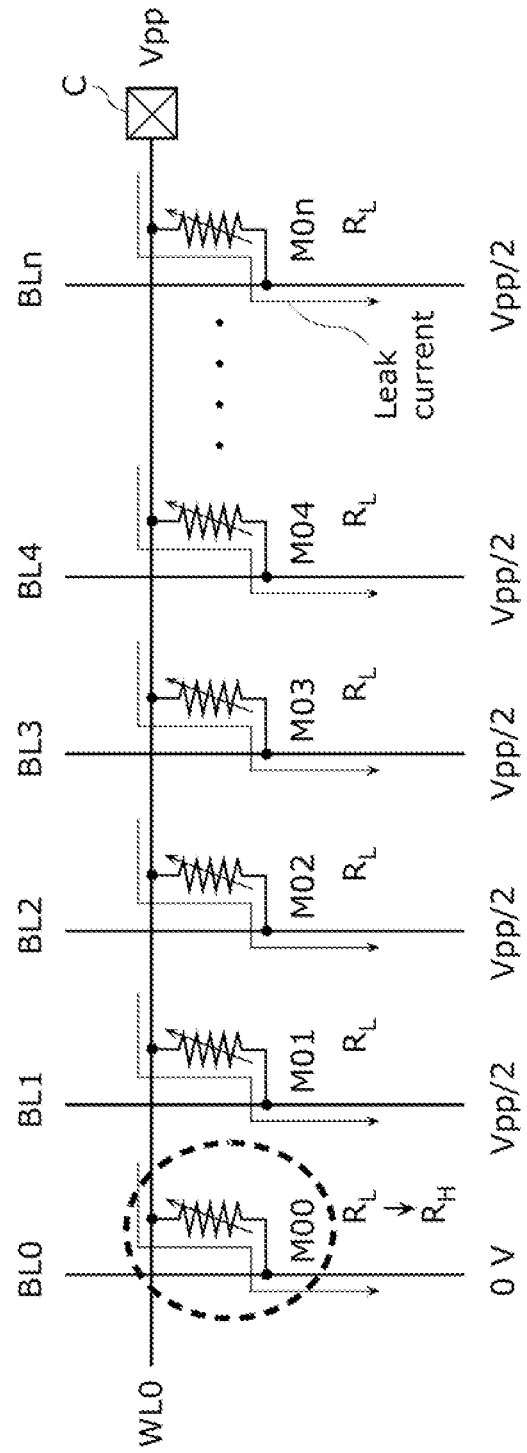
FIG. 22 is a circuit diagram schematically showing the essential parts of a conventional memory cell array.

FIG. 19 shows a configuration of the variable resistance nonvolatile memory device 100 according to the variation of Embodiment 2 of the present invention. The variable resistance nonvolatile memory device 100 shown in FIG. 19 includes, in addition to the structural elements shown in FIG. 14, inter-block switches 112 provided between blocks of the word lines.

When the initial breakdown operation is performed, the write circuit 105 first sets switch selection signals VAS1 through VAS-x to the power source potential, and sets switch selection signals NVAS1 through NVAS-n to the ground potential. In this state, the write circuit 105 performs the initial breakdown on memory cells included in the block 120-x.

After finishing the initial breakdown on the memory cells included in the block 120-x, the write circuit 105 sets the switch selection signal VAS-x to the ground potential and sets the switch selection signal NVAS-x to the power source potential. This turns off the inter-block switch 112 between the block 120-x and the block 120-x-1. In this state, the write circuit 105 performs the initial breakdown on memory cells included in the block 120-x-1. In the same manner, the write circuit 105 sequentially turns off the inter-block switches 112 each of which is adjacent, on the side closer to the row selection circuit 103, to a block for which the initial breakdown has finished. Then, in this state, the write circuit 105 performs the initial breakdown on a block which is adjacent, on the side closer to the row selection circuit 103, to the block for which the initial breakdown has finished. Lastly, the write circuit 105 performs the initial breakdown on memory cells included in the block 120-1.

In such a manner, the write circuit 105 performs the initial breakdown on memory cells included in a selected first block, and then turns off the inter-block switch 112 provided between the first block and a second block which is adjacent to the first block on the word lines' voltage supply side (the row selection circuit 103 side), before performing the initial breakdown on the second block.

By doing so, the block on which the initial breakdown has finished is disconnected from a selected memory cell, thereby enabling the initial breakdown of the selected memory cell without being adversely affected by the leak current.

Note that although FIG. 19 shows the case where the memory cell array is divided into blocks in the word line direction, the memory cell array may be divided into blocks in the bit line direction.

Furthermore, although the above description has shown the example in which the features in Embodiment 2 are added to the configuration of Embodiment 1, the present invention can also be implemented as a variable resistance nonvolatile memory device having only the features in Embodiment 2.

Thus far, the variable resistance nonvolatile memory device according to the embodiments of the present invention has been described. However, the present invention is not limited to these embodiments.

Each of the processing units included in the variable resistance nonvolatile memory device according to the embodiments is typically implemented as an LSI that is an integrated circuit. These processing units may be manufactured as individual chips, or some of all of the processing units may be integrated in one chip.

Furthermore, the means for circuit integration is not limited to LSI, and implementation with a dedicated circuit or a general-purpose processor is also possible. A field programmable gate array (FPGA) that can be programmed after manufacturing LSI or a reconfigurable processor that allows reconfiguration of the connection or setting of circuit cells in the LSI can be used for the same purpose.

Moreover, the variable resistance nonvolatile memory device according to Embodiments 1 and 2 may be combined with at least some of the functions according to the variations of Embodiments 1 and 2.

All the numerals above are mere examples used for specifically describing the present invention. Thus, the present invention is not limited to such numerals. Moreover, the logic levels represented as high/low or the switching states represented as on/off are mere examples used for specifically describing the present invention. It is thus possible to attain an equivalent result with a different combination of such logic levels or switching states. Furthermore, the n-type, the p-type, and so on of the transistors and the like are mere examples used for specifically describing the present invention. It is thus possible to attain an equivalent result with the inverted types of the transistors and so on. In addition, the materials of the structural elements described above are all mere examples used for specifically describing the present invention. Thus, the present invention is not limited to such materials. Moreover, the connections between the structural elements are mere examples used for specifically describing the present invention, and the connections achieving the functions of the present invention are not limited to these.

In addition, the divisions of the functional blocks shown in the block diagrams are mere examples, and the following are also possible: a plurality of functional blocks may be realized as one functional block; one functional block may be divided into a plurality of functional blocks; and a part of the functions may be transferred to a different functional block. Moreover, the functions of a plurality of functional blocks having similar functions may be processed by single hardware or software in parallel or by time division.

While the above description shows the examples using MOS transistors, other transistors such as a bipolar transistor may also be used.

Although only some exemplary embodiments of the present invention have been described in detail above, those skilled in the art will readily appreciate that many modifications are possible in the exemplary embodiments without materially departing from the novel teachings and advantages of the present invention. Accordingly, all such modifications are intended to be included within the scope of the present invention.

INDUSTRIAL APPLICABILITY

The present invention is applicable to variable resistance nonvolatile memory devices and is useful as a nonvolatile memory device used in various electronic devices such as digital home appliances, memory cards, mobile phones, and personal computers.

REFERENCE SIGNS LIST

1, Rij Variable resistance element
2, Dij Current steering element
10, Mij Memory cell
11, BLj Bit line
12, WLi Word line
13 Lower electrode
14 Diode layer
15 Internal electrode
16 Variable resistance layer
16a First transition metal oxide layer
16b Second transition metal oxide layer
17 Upper electrode
100 Variable resistance nonvolatile memory device
101 Memory body
102 Memory cell array
103 Row selection circuit
104 Column selection circuit
105 Write circuit
105a1 First LR drive circuit
105a2 Second HR drive circuit
105b Current limit circuit
105c1 First HR drive circuit
105c2 Second LR drive circuit
106 Read circuit
107 Data input/output circuit
108 Address input circuit
109 Control circuit
110 Control circuit
111 Capacitive load circuit
111a Capacitive load element
111b Selection switch
112 Inter-block switch
120 Block

The invention claimed is:

1. A variable resistance nonvolatile memory device including: a plurality of first signal lines; a plurality of second signal lines crossing the first signal lines; and a memory cell array including a plurality of memory cells provided at cross-points of the first signal lines and the second signal lines, each of the memory cells including a variable resistance element and a current steering element which is connected to the variable resistance element in series and has two terminals, the variable resistance element having a resistance state which changes to (i) a low resistance state when a first voltage of a predetermined first polarity is applied to the variable resistance element, and (ii) a high resistance state when a second voltage of a second polarity opposite to the first polarity is applied to the variable resistance element, the low resistance state being a state in which the variable resistance element has a resistance value in a first range, and the high resistance state being a state in which the variable resistance element has a resistance value in a second range higher than the first range, the variable resistance nonvolatile memory device comprising:

a write circuit which performs (i) low resistance writing by which the resistance state of the variable resistance element changes to the low resistance state, by applying, to each of the memory cells, a low resistance writing voltage via a corresponding one of the first signal lines and a corresponding one of the second signal lines, and (ii) high resistance writing by which the resistance state of the variable resistance element changes to the high resistance state, by applying, to each of the memory cells, a high resistance writing voltage via the corresponding one of the first signal lines and the corresponding one of the second signal lines, the low resistance writing voltage being a voltage of the first polarity and greater than or equal to the first voltage in absolute value, and the high resistance writing voltage being a voltage of the second polarity and greater than or equal to the second voltage in absolute value;

a first selection circuit which selects one or more of the first signal lines; and a second selection circuit which selects one or more of the second signal lines, wherein the memory cells are grouped into a plurality of blocks, each of the blocks includes a plurality of memory cells, and the write circuit further performs the following:

performs initial breakdown on one or more of the variable resistance elements in an initial state after the variable resistance nonvolatile memory device is manufactured, by applying an initial breakdown voltage to the one or more of the variable resistance elements via a corresponding one or more of the first signal lines and a corresponding one or more of the second signal lines, the initial breakdown being a process by which the initial state of the one or more of the variable resistance elements changes to a state in which resistance of the one or more of the variable resistance elements variable through the low resistance writing and the high resistance writing, and the initial breakdown voltage being greater than the low resistance writing voltage and the high resistance writing voltage in absolute value;

applies, in the initial breakdown, the initial breakdown voltage to the one or more of the first signal lines selected by the first selection circuit and the one or more of the second signal lines selected by the second selection circuit, via the first selection circuit and the second selection circuit; and sequentially selects blocks from among the blocks in an order starting from a block farthest from at least one of the first selection circuit and the second selection circuit and finishing with a block closest to the at least one of the first selection circuit and the second selection circuit, and performs, for each of the selected blocks, the initial breakdown on each of memory cells included in the selected block.

2. The variable resistance nonvolatile memory device according to claim 1, wherein, for each of the selected blocks, the write circuit sequentially selects memory cells from among the memory cells included in the selected block, in an order starting from a memory cell farthest from at least one of the first selection circuit and the second selection circuit and finishing with a memory cell closest to the at least one of the first selection circuit and the second selection circuit, and performs the initial breakdown on each of the selected memory cells.

3. The variable resistance nonvolatile memory device according to claim 1, wherein the write circuit sequentially selects blocks from among the blocks in a zigzag manner in an order starting from a block farthest from the first selection circuit and farthest from the second selection circuit and finishing with a block closest to the first selection circuit and closest to the second selection circuit, and performs, for each of the selected blocks, the initial breakdown on each of memory cells included in the selected block.

4. The variable resistance nonvolatile memory device according to claim 1,
wherein the blocks are arrayed in rows and columns, and the write circuit:
sequentially selects lines from among a plurality of lines which are either the rows or columns of the blocks and are in parallel to the first signal lines, in an order starting from a line farthest from the second selection circuit and finishing with a line closest to the second selection circuit; and
for each of the selected lines, sequentially selects blocks from among a plurality of blocks arrayed in the selected line, in an order starting from a block farthest from the first selection circuit and finishing with a block closest to the first selection circuit.

5. The variable resistance nonvolatile memory device according to claim 1, further comprising
a plurality of inter-block switches each provided between the blocks arrayed in the first signal lines,
wherein the write circuit performs the initial breakdown on memory cells included in a selected first block, and then turns off one of the inter-block switches which is provided between the first block and a second block before performing the initial breakdown on the second block, the second block being adjacent to the first block on a side of the one of the first selection circuit and the second selection circuit.

6. The variable resistance nonvolatile memory device according to claim 1, further comprising
a current limit circuit which is provided on a path of current flowing from the write circuit to the memory cells, and limits, between current in a first direction and current in a second direction, only the current in the first direction, the current in the first direction being current which changes resistance states of the memory cells to the high resistance state, and the current in the second direction being current which changes the resistance states of the memory cells to the low resistance state,
wherein the write circuit applies, in the initial breakdown, the initial breakdown voltage of the second polarity to the memory cells, and
the current limit circuit limits, in the initial breakdown, the current flowing in the path in the first direction.

7. The variable resistance nonvolatile memory device according to claim 6,
wherein each of the memory cells has a resistance state which changes to (i) the low resistance state when the first voltage of the first polarity is applied to the memory cell via a connected one of the first signal lines and a connected one of the second signal lines and (ii) the high resistance state when the second voltage of the second polarity opposite to the first polarity is applied to the memory cell via the connected one of the first signal lines and the connected one of the second signal lines, the first voltage of the first polarity being a voltage when a voltage at the connected one of the first signal lines is higher than a voltage at the connected one of the second signal lines,
the write circuit includes (i) a first drive circuit which generates a first drive voltage greater than or equal to the first voltage, (ii) a second drive circuit which generates a second drive voltage greater than or equal to the second voltage, (iii) a third drive circuit which generates a reference voltage for the first drive voltage, and (iv) a fourth drive circuit which generates a reference voltage for the second drive voltage,
the first selection circuit selects one of the first signal lines, and connects the selected first signal line with the first drive circuit and the fourth drive circuit,
the second selection circuit selects one of the second signal lines, and connects the selected second signal line with the second drive circuit and the third drive circuit, and
the current limit circuit is provided between the fourth drive circuit and the first selection circuit.

8. The variable resistance nonvolatile memory device according to claim 6,
wherein each of the memory cells has a resistance state which changes to (i) the low resistance state when the first voltage of the first polarity is applied to the memory cell via a connected one of the first signal lines and a connected one of the second signal lines and (ii) the high resistance state when the second voltage of the second polarity opposite to the first polarity is applied to the memory cell via the connected one of the first signal lines and the connected one of the second signal lines, the first voltage of the first polarity being a voltage when a voltage at the connected one of the first signal lines is higher than a voltage at the connected one of the second signal lines,
the write circuit includes (i) a first drive circuit which generates a first drive voltage greater than or equal to the first voltage, (ii) a second drive circuit which generates a second drive voltage greater than or equal to the second voltage, (iii) a third drive circuit which generates a reference voltage for the first drive voltage, and (iv) a fourth drive circuit which generates a reference voltage for the second drive voltage,
the first selection circuit selects one of the first signal lines, and connects the selected first signal line with the first drive circuit and the fourth drive circuit,
the second selection circuit selects one of the second signal lines, and connects the selected second signal line with the second drive circuit and the third drive circuit, and
the current limit circuit is provided between the second drive circuit and the second selection circuit.

9. The variable resistance nonvolatile memory device according to claim 6,
wherein the current limit circuit (i) limits, in a first period, a value of the current flowing in the path in the first direction to a first current value, and (ii) limits, in a second period, the value of the current flowing in the path in the first direction to a second current value smaller than the first current value, the first period starting after application of the initial breakdown voltage to the memory cell starts and ending before the initial breakdown is performed on the memory cell, and the second period starting after the first period and including a time at which the initial breakdown is performed on the memory cell.

10. The variable resistance nonvolatile memory device according to claim 9,
wherein the current limit circuit detects that a voltage at either the selected first signal line or the selected second signal line has reached a predetermined voltage, and changes a value of current to be limited, from the first current value to the second current value when detecting that the voltage at either the selected first signal line or the selected second signal line has reached the predetermined voltage.

11. The variable resistance nonvolatile memory device according to claim 7, further comprising:
- a capacitive load element; and
- a selection switch which turns on and off a connection between the capacitive load element and a node between the current limit circuit and the first selection circuit,
- wherein the selection switch turns on the connection between the capacitive load element and the node at a time of the initial breakdown.

12. The variable resistance nonvolatile memory device according to claim 8, further comprising:
- a capacitive load element; and
- a selection switch which turns on and off a connection between the capacitive load element and a node between the current limit circuit and the second selection circuit,
- wherein the selection switch turns on the connection between the capacitive load element and the node at a time of the initial breakdown.

13. The variable resistance nonvolatile memory device according to claim 1,
- wherein the variable resistance element includes a first electrode, a second electrode, and a transition metal oxide layer interposed between the first electrode and the second electrode, and
- the transition metal oxide layer includes (i) an oxygen-deficient first transition metal oxide layer in contact with the first electrode and (ii) a second transition metal oxide layer in contact with the second electrode and less than the oxygen-deficient first transition metal oxide layer in degree of oxygen deficiency.

* * * * *